United States Patent [19]

Kazarian et al.

[11] Patent Number: 5,670,895

[45] Date of Patent: Sep. 23, 1997

[54] ROUTING CONNECTIONS FOR PROGRAMMABLE LOGIC ARRAY INTEGRATED CIRCUITS

[75] Inventors: Peter J. Kazarian, Cupertino; Bruce B. Pedersen, San Jose; Francis B. Heile, Santa Clara; David Wolk Mendel, Sunnyvale, all of Calif.

[73] Assignee: Altera Corporation, San Jose, Calif.

[21] Appl. No.: 545,084

[22] Filed: Oct. 19, 1995

[51] Int. Cl.⁶ .......................... H03K 7/38; H03K 19/173
[52] U.S. Cl. .................................. 326/39; 326/40
[58] Field of Search ........................... 326/39, 40

[56] References Cited

U.S. PATENT DOCUMENTS

| | | |
|---|---|---|
| Re. 34,363 | 8/1993 | Freeman . |
| 3,473,160 | 10/1969 | Wahlstrom ............... 340/172.5 |
| 4,609,986 | 9/1986 | Hartmann et al. .......... 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. .......... 364/900 |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 5,121,006 | 6/1992 | Pedersen . |
| 5,220,214 | 6/1993 | Pedersen . |
| 5,258,668 | 11/1993 | Cliff et al. . |
| 5,260,610 | 11/1993 | Pedersen et al. . |
| 5,260,611 | 11/1993 | Cliff et al. . |
| 5,274,581 | 12/1993 | Cliff et al. ............... 364/784 |
| 5,350,954 | 9/1994 | Patel . |
| 5,371,422 | 12/1994 | Patel et al. ............... 326/41 |
| 5,543,732 | 8/1996 | McClintock et al. ....... 326/39 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Development in Switching Theory*, A. Mukhopadhyay, ed., Academic Press, New York, 1971, Chapters VI an IX, pp. 229–254 and 369–422.

El Gamel et al., "An Architecture for Electrically Configurable Gate Arrays," IEEE Journal of Solid–State circuits, vol. 24, No. 2, Apr. 1989, pp. 394–398.

El–Ayat et al., "A CHOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Richard Roseen
*Attorney, Agent, or Firm*—Fish & Neave; Robert R. Jackson

[57] ABSTRACT

Logic signal routability in programmable logic array integrated circuit devices is improved by selecting the possible interconnections between various resources on the device so that various constraints or goals are satisfied. Improving routability in this way tends to reduce instances in which desired interconnections are blocked by other connections that have already been made.

35 Claims, 23 Drawing Sheets

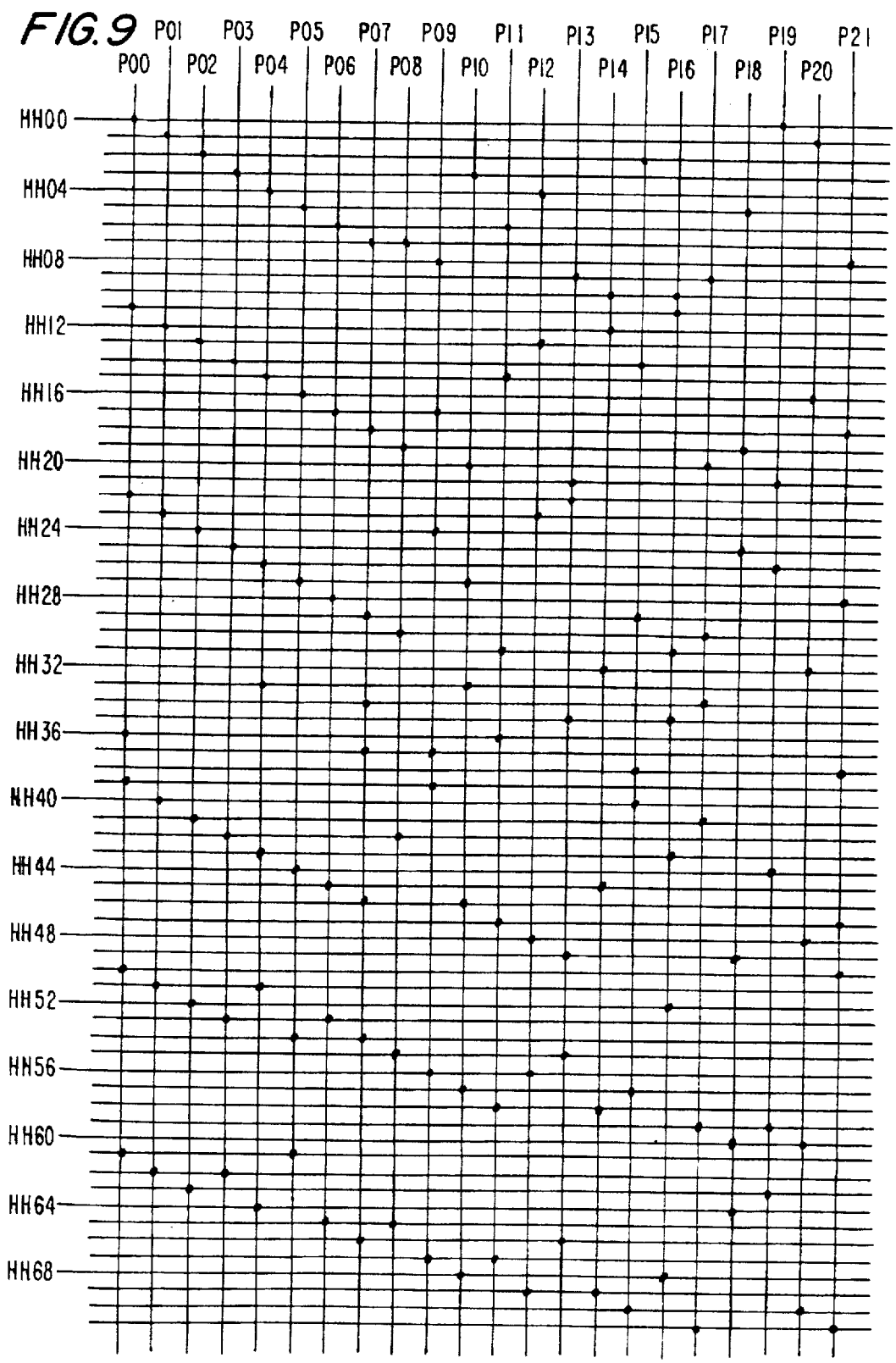

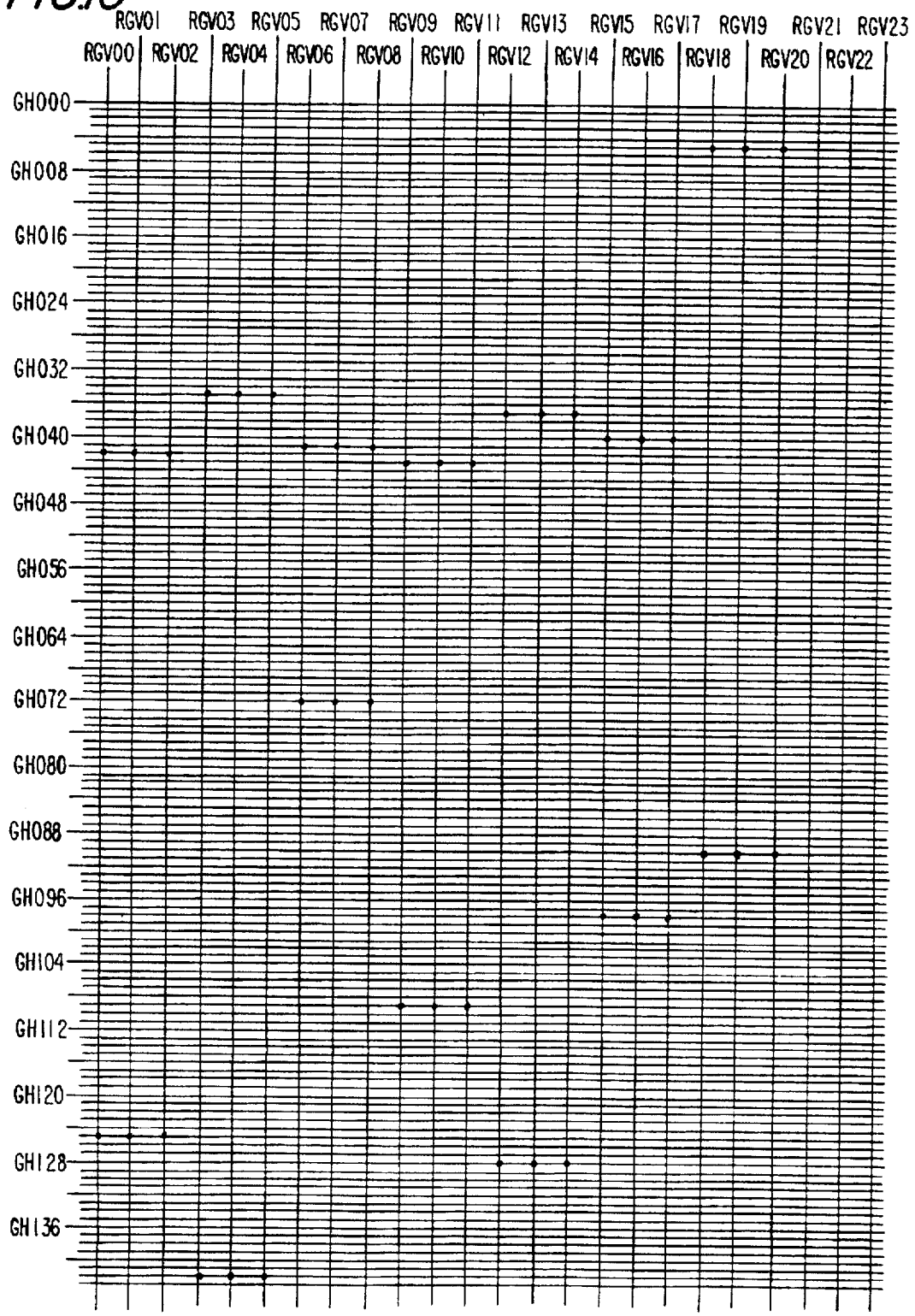

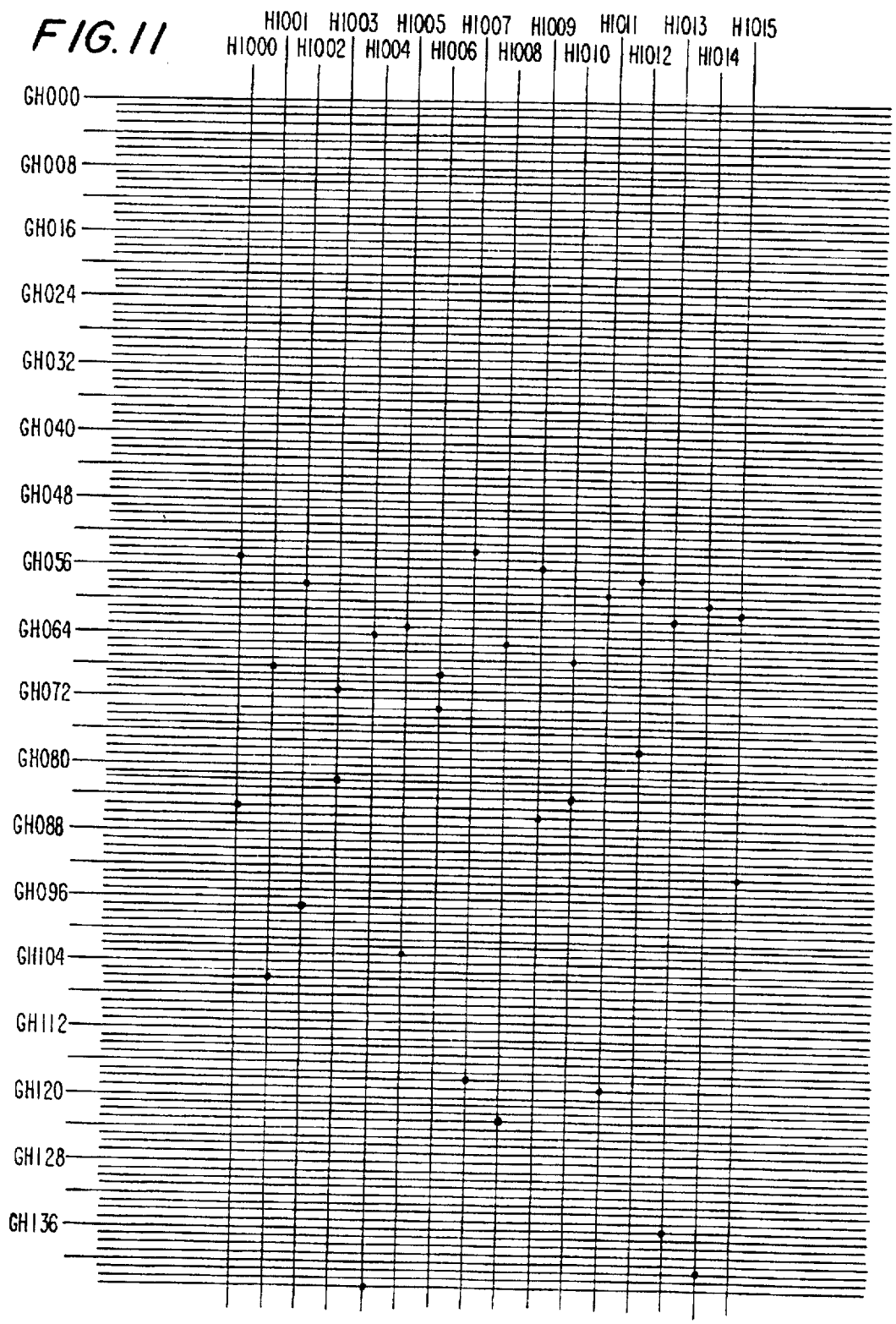

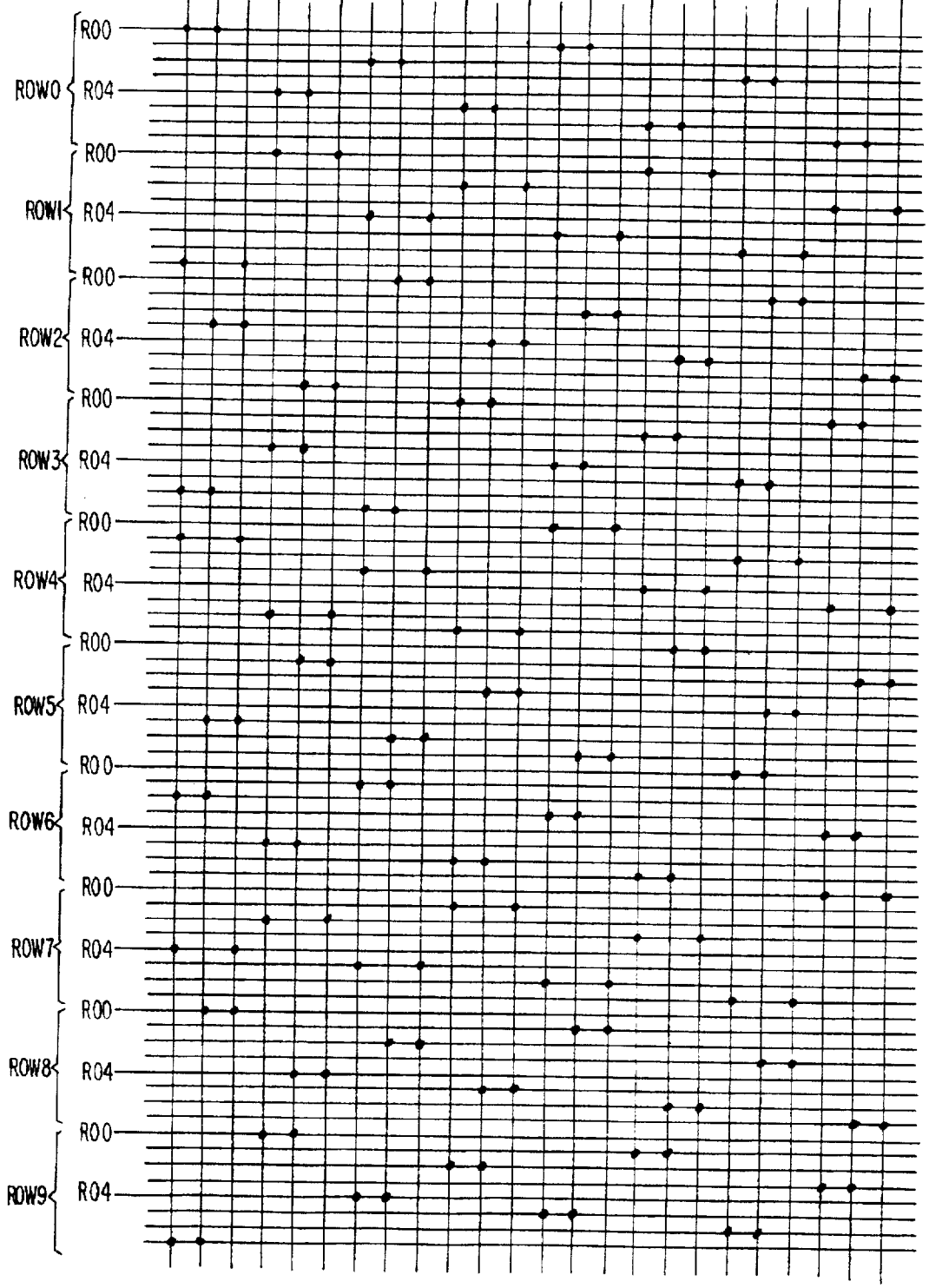

FIG. 15c

ROUTING CONNECTIONS FOR PROGRAMMABLE LOGIC ARRAY INTEGRATED CIRCUITS

BACKGROUND OF THE INVENTION

This invention relates to programmable logic array integrated circuit devices, and more particularly to the manner in which routing connections are provided in such devices.

In a typical programmable logic array integrated circuit device regions of programmable logic are disposed on the device in a two-dimensional array of intersecting rows and columns of such regions. Each region receives several input logic signals and is programmable to perform any of several logic functions on the input signals to produce at least one output logic signal. Interconnection conductors are provided for conveying logic signals to, between, and from the logic regions so that more complex logic functions can be performed by concatenating the relatively simple logic functions performable by the individual logic regions. These interconnection conductors are programmably connectable to one another and to the inputs and outputs of the logic regions so that the manner in which signals are routed through the device is programmable by a user of the device in the same manner that the logic performed by the individual logic regions is programmable by the user.

Programmable logic array devices are typically intended to be general-purpose devices. The manufacturer of such a device does not know all the uses to which users may want to put the device. It is therefore desirable for the manufacturer to make the device as general as possible. In the absence of other constraints this would mean providing large numbers of interconnection conductors with completely general matrices of programmable switches between those conductors. This would substantially eliminate the possibility of any desired interconnection being blocked by other desired interconnections (e.g., because of exhaustion of the supply of interconnection conductors or the supply of programmable interconnection switches).

On the other hand, providing such large numbers of interconnection conductors and switches has several disadvantages. In many applications of the device many of these conductors and switches will not be used. Large numbers of switches increase the loading on the conductors to which those switches are connected, thereby slowing down the device and/or increasing the power required to drive the interconnection conductors. Each programmable switch requires a programmable control element and circuitry for allowing that control element to be programmed. Large numbers of programmable switches therefore increase the "overhead" required on the integrated circuit (i.e., circuitry which does not actually perform any logic during end use of the device).

Because there are thus such substantial disadvantages to providing completely general routing capability, it is important to reduce the amounts of interconnection resources that are provided and to optimize the usability of those resources to provide the largest possible number of different interconnection patterns, each including the largest possible number of interconnection routes. Stated another way, even though the numbers and arrangements of the interconnection conductors and switches provide substantially less than completely general interconnectivity, these resources should be configured to reduce as much as possible the potential for blocking of desired interconnections in order to maximize the usability of the chip in the widest possible range of applications.

In view of the foregoing it is an object of this invention to provide improved interconnection resource arrangements for programmable logic array devices.

It is another more particular object of this invention to provide patterns of interconnection resources for programmable logic array devices that improve signal routability through those resources.

SUMMARY OF THE INVENTION

These and other objects of the invention are accomplished in accordance with the principles of the invention by providing interconnection resources that are less than completely general but that provide very good or optimum routability through the resources that are provided by reducing or minimizing the potential for different interconnection paths to block one another. For example, preferred interconnection patterns are provided between input/output pins of the device and interconnection conductors on the device. Preferred interconnection patterns are also provided between the outputs of random access memories ("RAMs") and interconnection conductors on the device. Preferred interconnection patterns are further provided between logic region outputs and interconnection conductors on the device. And preferred interconnection patterns are provided between interconnection conductors and the inputs of the above-mentioned RAMs on the device.

Further features of the invention, its nature and various advantages will be more apparent from the accompanying drawings and the following detailed description of the preferred embodiments.

BRIEF DESCRIPTION OF THE DRAWINGS

FIG. 9 is a schematic diagram showing another representative portion of an illustrative programmable connection pattern in accordance with the principles of this invention.

FIG. 10 is a schematic diagram showing yet another representative portion of an illustrative programmable connection pattern in accordance with the principles of this invention.

FIG. 11 is a schematic diagram showing still another representative portion of an illustrative programmable connection pattern in accordance with the principles of this invention.

FIG. 13 is a schematic diagram showing another representative portion of an illustrative pattern of programmable connections in accordance with the principle of this invention.

FIGS. 15a–c are collectively a schematic diagram showing still another representative portion of an illustrative pattern of programmable connections in accordance with the principles of this invention.

DETAILED DESCRIPTION OF THE PREFERRED EMBODIMENTS

Figure 1:
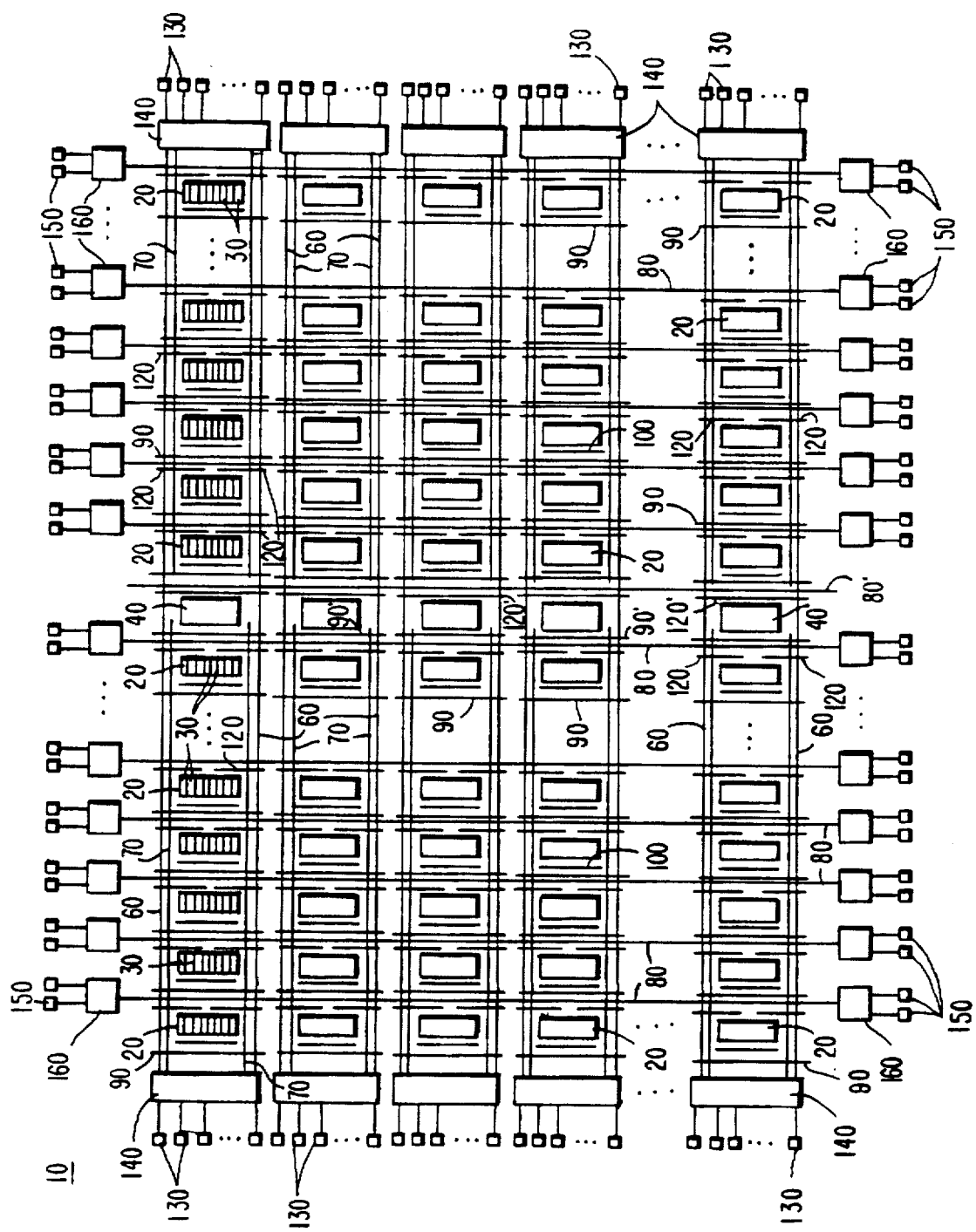
FIG. 1 is a simplified, partial, schematic block diagram of an illustrative programmable logic array device that can be constructed in accordance with the principles of this invention.

An illustrative programmable logic array integrated circuit device 10 which can be constructed in accordance with this invention is shown in FIG. 1. Aspects of device 10 that are relevant to this invention will first be described in general terms with reference to FIGS. 1–7. Thereafter, specific features of the invention will be explained. Although various aspects of the invention will thus be described in the context of device 10, it will be understood that the invention is also applicable to other such devices which can have characteristics different from device 10. Some examples of possible variations in device 10 are mentioned elsewhere in this specification.

With reference to FIG. 1, illustrative device 10 has a plurality of regions 20 of programmable logic disposed on the device in a two-dimensional array of intersecting rows and columns of such regions. In the depicted preferred embodiment device 10 has ten rows of regions 20, 36 regular columns of regions 20, and two spare columns of regions 20. The spare columns (which are not shown in FIG. 1, but which are shown in part in FIG. 2) are used only when a regular column is found to be defective. The columns are divided into two groups: (1) 18 regular columns and one spare column to the left of a central column of random access memory ("RAM") regions 40, and (2) 18 regular columns and one spare column to the right of the central column of RAM regions 40. The spare column to the left of RAM regions 40 can only be used to compensate for a defective regular column to the left of regions 40. Similarly, the spare column to the right of RAM regions 40 can only be used to compensate for a defective regular column to the right of region 40.

Each region 20 includes a plurality of subregions or logic modules 30 of programmable logic. In the depicted preferred embodiment there are eight logic modules 30 in each region 20. To simplify FIG. 1 the subdivision of regions 20 into logic modules 30 is only shown in the first row of that FIG.

Although logic modules 30 may be constructed in many other ways (e.g., as product-term-based macrocells), in the depicted preferred embodiment (see especially FIG. 3) each logic module includes a four-input look-up table or comparable universal logic block ("ULB") 32 and a flip-flop or register device 34. Each ULB 32 can be independently programmed to provide as an output signal any logical combination of four inputs 36 to the logic module 30 that includes that ULB. The output signal of the ULB can be registered by the associated flip-flop 34 and then made the output signal 38 of the logic module, or the output signal of the ULB can be applied directly to output 38 (i.e., without registration by the flip-flop). Each logic module 30 also has a cascade input 52 and a carry-in input 54 from an adjacent logic module, as well as a cascade output 52 and a carry-out output 54 to another adjacent logic module. These inputs 52/54 can be combined with or substituted for regular inputs 36 to facilitate provision of large fan-in functions or the performance of adder and counter functions. Suitable cascade circuitry is shown in more detail in Cliff et al. U.S. Pat. No. 5,258,668. Suitable carry circuitry is shown in more detail in Cliff et al. U.S. Pat. No. 5,274,581. (The cascade connection 52t from the row above is a special connection used for test purposes and is not germane to the present inventor.)

Returning to FIG. 1, each row has two groups of horizontal interconnection conductors 60 that extend the entire length of the row, one group of conductors 60 being above the row and the other group being below the row. In the depicted preferred embodiment each of these groups includes 72 conductors. (In some other views, such as FIGS. 2 and 3, all of conductors 60 associated with a row are shown on one side of the row for greater simplicity.) Conductors 60 are sometimes referred to as full-horizontal conductors or as global horizontal conductors. Each conductor 60 preferably extends continuously or substantially continuously along the entire length of the associated row and is not made up of shorter conductor segments that are optionally programmably pieced together.

Each row also has four groups of horizontal interconnection conductors 70 that extend along half the length of the row. Two of these groups extend respectively along the top and bottom of the left half of the row. The other two groups of these conductors 70 extend respectively along the top and bottom of the right half of the row. In the depicted preferred embodiment each of these groups includes 36 conductors. (Again, in some other FIGS. all of the conductors 70 associated with the left or right half of a row are shown on one side of the row for greater simplicity.) The conductors 70 associated with each half of a row are preferably not directly connectable to the conductors 70 associated with the other half of the row. Conductors 70 are sometimes referred to as half-horizontal conductors. Each conductor 70 preferably extends continuously or substantially continuously along the length of the associated half row and is not made up of shorter conductor segments that are optionally programmably pieced together.

Each column of regular logic regions 20 has a group of vertical interconnection conductors 80 that extend continuously or substantially continuously along the entire length of the column. In the depicted preferred embodiment each of these groups includes 24 conductors 80.

In order to feed logic signals to each region 20, each regular logic region has an associated plurality of region feeding conductors 90 that can bring signals to the logic region from the horizontal conductors 60 and 70 associated with that region. In the depicted preferred embodiment there are 22 region feeding conductors 90 associated with each regular logic region 20. The manner in which conductors 90 are programmably connectable to conductors 60, 70, and 36 (FIG. 3) will be discussed in detail below.

Each region 20 also has eight associated local feedback conductors 100. Each conductor 100 makes the output signal 38 (FIG. 3) of a respective one of the logic modules 30 in the associated region 20 available as an input to any of the logic modules in that region without having to use any interconnection resources that are not exclusively associated with the region.

Each region 20 also has output conductors 120 for conveying the output logic signals 38 (FIG. 3) of the logic modules 30 in that region to the associated conductors 60 and 70. Conductors 120 convey the output signals of the upper four logic modules 30 in a region 20 to the conductors 60 and 70 that are above the region. Other conductors 120 associated with the region convey the output signals of the lower four logic modules 30 in the region to the conductors 60 and 70 that are below the region. The manner in which conductors 120 are programmably connectable to conductors 60 and 70 is discussed in more detail below. The output signals 38 (FIG. 3) of each regular logic region 20 are also programmably connectable to the vertical conductors 80 associated with that region. This will also be discussed in more detail below.

Programmable logic connectors ("PLCs") (not shown in FIG. 1 but shown elsewhere such as at 242 in FIG. 3) are associated with each regular logic region 20 for making connections from the vertical (80) to the horizontal (60 and 70) conductors associated with the region. Other PLCs (not shown in FIG. 1 but shown elsewhere such as at 270 in FIG. 4) are associated with each regular logic region 20 for making connections from the horizontal (60) to the vertical (80) conductors associated with the region.

PLCs 242 and 270 (and other PLCs used throughout device 10) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCS can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473, 160), ferro-electric memories, fuses, antifuses, or the like. Any of these technologies can also be used to implement the programmable memories of above-described ULBs 32. From the various examples mentioned above it will be seen that this invention is applicable both to one-time-only programmable and reprogrammable devices. However, for at least some features of the invention, the especially preferred embodiments tend to be reprogrammable because reprogrammable devices tend to benefit more from the economies of interconnection resources that result from the practice of this invention.

At each end of each row there are eight "horizontal" input/output pins 130. The input/output pins 130 associated with each end of each row are programmably connectable to the adjacent conductors 60 and 70 associated with that row via PLC networks 140. The construction of networks 140 is discussed in more detail below.

At the top and bottom of each column of regular logic regions 20 there are two "vertical" input/output pins 150. The input/output pins 150 associated with each end of each column are programmably connectable to the conductors 80 associated with that column via PLC networks 160. Networks 160 can be generally similar to networks 140.

As has been mentioned, at the center of each row, there is a region of RAM 40 that is programmable and usable by the user to store and output any desired data. Each RAM region 40 can receive data via a plurality of RAM feeding conductors 90'. In the depicted preferred embodiment there are 22 conductors 90' associated with each RAM region 40. Conductors 90' can receive signals from the conductors 60 and from the left half of the conductors 70 associated with the row that includes the RAM region served by those conductors 90'. The manner in which conductors 90' are programmably connectable to conductors 60 and 70 is discussed in more detail below.

Each RAM region 40 can output its data to an associated plurality of RAM output conductors 120' and also to a plurality of vertical interconnection conductors 80' that extend along the length of the column of RAM regions. Conductors 120' can be used to apply the associated RAM output signals to the conductors 60 associated with the row that includes the RAM region 40 producing those output signals. Conductors 80' can be used to convey the RAM output signals to other rows of the device. In the depicted preferred embodiments there are 24 conductors 80'.

Each RAM region 40 also includes PLCs (not shown in FIG. 1 but shown at 454 in FIG. 7) that can be used to connect conductors 80' to the conductors 60 associated with the row that includes that RAM region.

Figure 2:
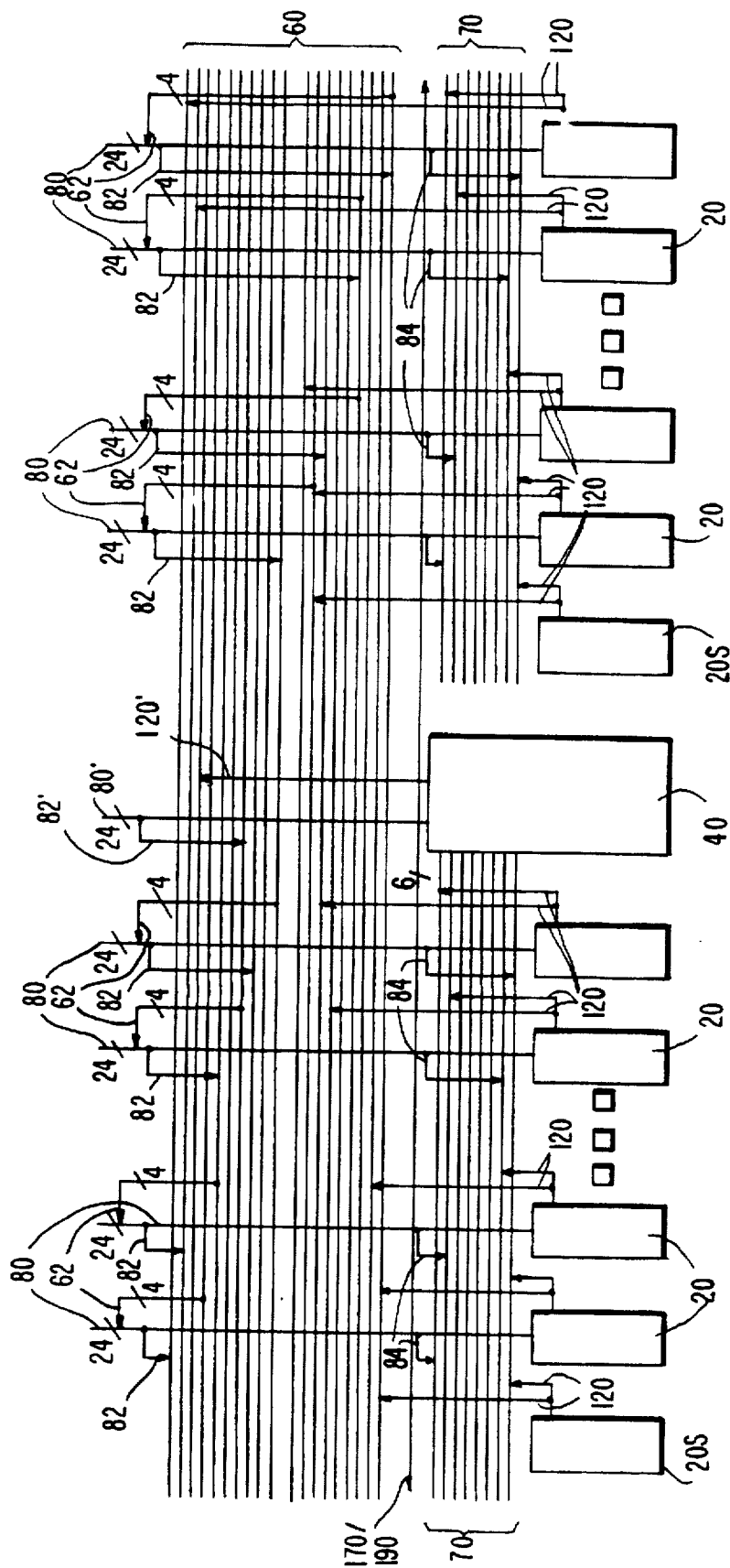
FIG. 2 is a more detailed, but still simplified, schematic block diagram of a representative portion of the apparatus of FIG. 1.
Figure 3:
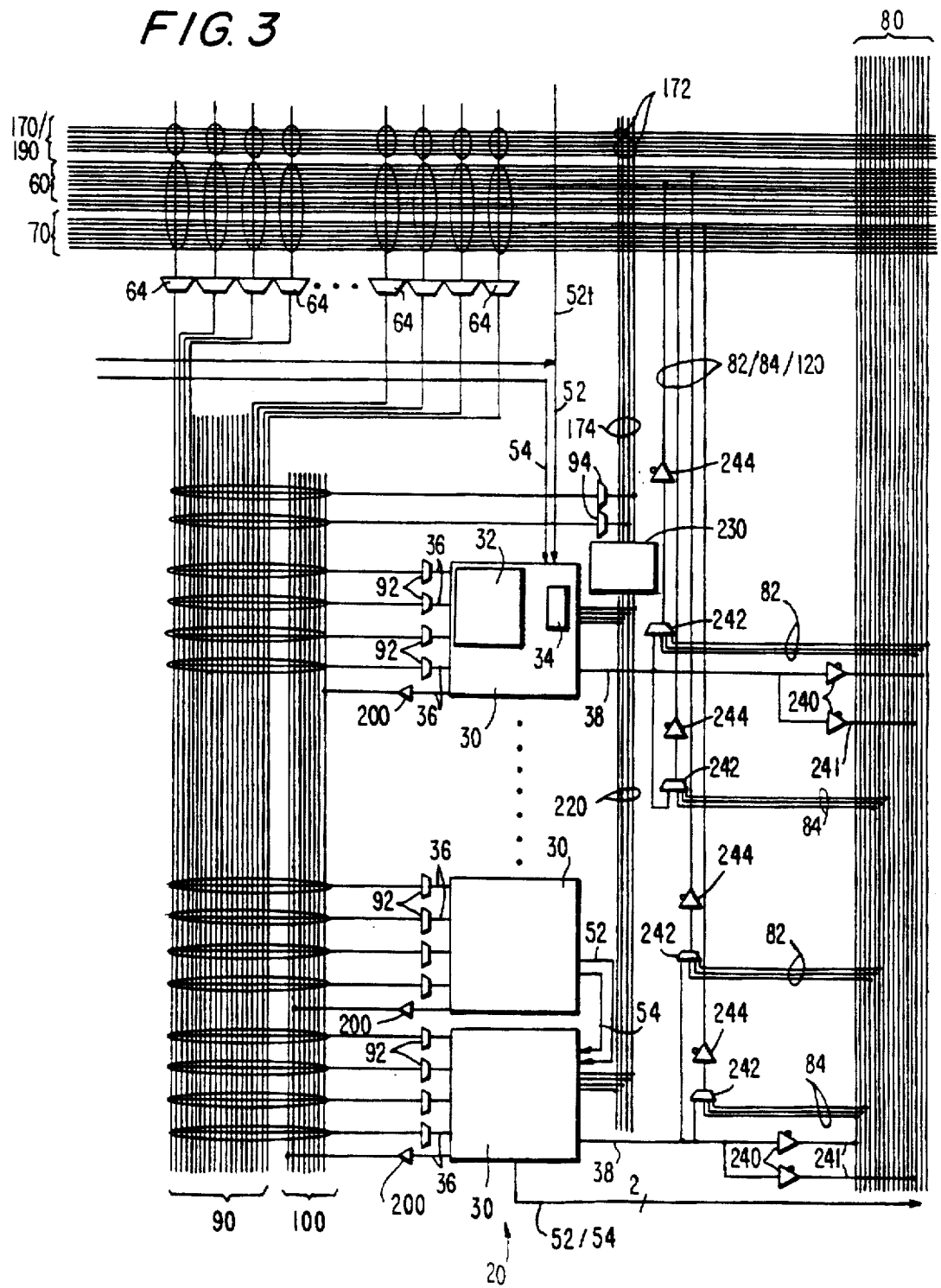
FIG. 3 is a still more detailed, but still simplified, schematic block diagram of a representative portion of the apparatus of FIG. 1.
Figure 6:
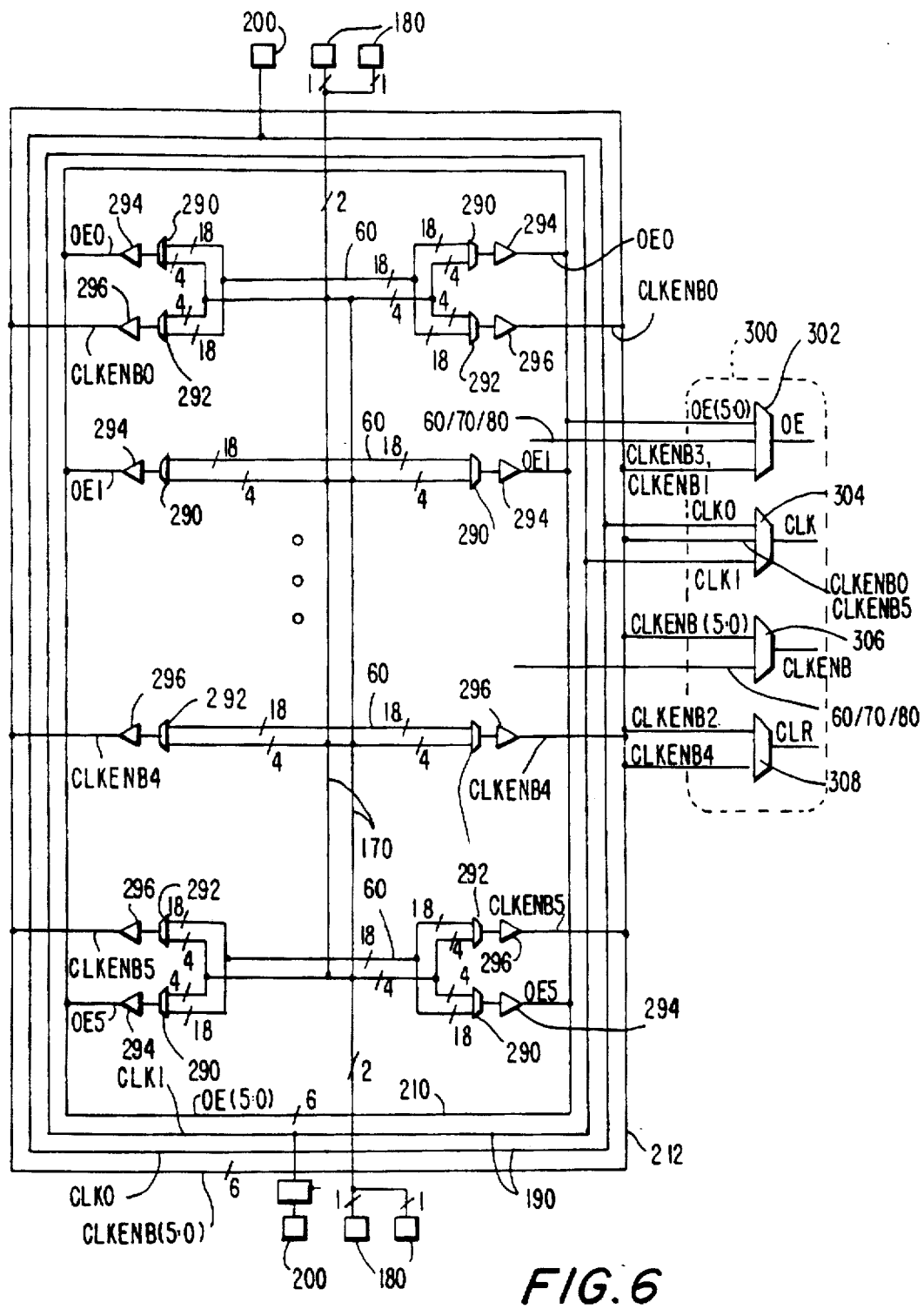
FIG. 6 is a simplified schematic block diagram of additional features of the apparatus of FIG. 1.

It will be apparent from the ensuing discussion that device 10 includes more circuitry than is shown in FIG. 1. For example, FIG. 6 shows that there are four so-called fast lines 170 that extend from four dedicated input pins 180 to the vicinity of every region 20 (see also FIGS. 2 and 3). FIG. 6 also shows that the device is ringed by a so-called peripheral bus that includes two clock signal conductors 190 (extending from two dedicated clock input terminals 200), six output enable signal conductors 210, and six clock enable signal conductors 212. FIGS. 2 and 3 show that the two clock signal conductors 190 (like fast conductors 170) extend to the vicinity of every region 20 on the device.

FIG. 2 illustrates some of the connections of a typical row in somewhat more detail than FIG. 1. It will be understood, however, that FIG. 2 tends to show only a few representative conductors of each type, or in some cases represents several conductors by a single line. FIG. 2 also shows the two spare logic regions (designated 20s) in a typical row.

FIG. 2 shows that there are several programmable connections 62 from the conductors 60 associated with each row to the conductors 80 associated with each column. In the depicted preferred embodiment there are four such programmable connections 62 from each row to each column. The connections 62 along each row are distributed over the conductors 60 associated with that row. Similarly, the connections 62 along each column are distributed over the conductors 80 associated with that column.

FIG. 2 also shows that there are programmable connections 82 from the conductors 80 associated with each column to the conductors 60 associated with each row, as well as programmable connections 84 from the conductors 80 associated with each column to the conductors 70 associated with each row. The connections 82 and 84 along each column are distributed over the conductors 80 associated with that column. Similarly, the connections 82 and 84 along each row are respectively distributed over the conductors 60 and 70 associated with that row.

FIG. 2 further shows that each logic module 30 in each region 20 in a row can drive one conductor 60 and one conductor 70 associated with the row that includes that region. This is done via programmable connections 120, which are, of course, also shown in FIG. 1 and partly described above. FIG. 2 shows that the connections 120 along a row are distributed over the conductors 60 and 70 associated with that row.

FIG. 2 still further shows that the left half of the conductors 70 associated with a row can supply inputs to the RAM region 40 associated with that row. (The conductors 60 associated with a row can also supply inputs to the RAM region 40 associated with that row, but this is better shown in FIG. 7.) Outputs of a RAM region can be applied to certain of the associated conductors 60 via programmable connections 120'. There are programmable connections 82' from conductors 80' associated with the RAM column to the conductors 60 associated with each row.

FIG. 2 also shows the availability of the four fast conductors 170 and the two dedicated clock conductors 190 adjacent each region 20 in a row.

FIG. 3 shows various aspects of a representative region 20 and associated apparatus in more detail. Each of the 22 region feeding conductors 90 associated with a region receives the output of a PLC 64 (a 21 to 1 multiplexer in the depicted, presently preferred embodiment) associated with that conductor 90. The 21 inputs to each PLC 64 associated with a region are different subsets of fast conductors 170, dedicated clock conductors 190, the conductors 60 associated with the row that includes the region, and the conductors 70 associated with the half row that includes the region. Thus the inputs to each PLC 64 are a partial population of the conductors 60, 70, 170, and 190 associated with the region. As a multiplexer, each of PLCs 64 is programmable to connect any one of its inputs to its output. This is similarly true of the other multiplexers mentioned throughout this specification.

The main output logic signal 38 of each logic module 30 in a region 20 is applied (via a feedback buffer 200) to a respective one of the local feedback conductors 100 associated with that region. As was mentioned in connection with FIG. 1, local feedback conductors 100 are associated with each region 20 to make the output of each logic module 30 in the region available as a possible input to any logic module in the region without having to use any of the more general interconnection resources of the chip to provide such local interconnectivity.

The signal on any of conductors 90 or 100 associated with a region 20 can be applied to any of the main inputs 36 of any logic module 30 in that region via a PLC 92 (a 30 to 1 multiplexer in the depicted, presently preferred embodiment) that is associated with that input 36. Thus the inputs to each PLC 92 are a full population of associated conductors 90 and 100.

Each logic module 30 in a region 20 can also receive any of several control signals via leads 220. The signals on these leads may be used by the logic module for such purposes as a clock signal for the flip-flop 34 of the logic module and/or a clear signal for the flip-flop of the logic module. Circles 172 in FIG. 3 represent fully populated PLCs for selectively bringing the signals on fast conductors 170 and dedicated clock conductors 190 into the region via leads 174 for possible use on leads 220 in that region. Certain of leads 174 can alternatively carry so-called asynchronous clock and/or clear signals derived from the conductors 90 and/or 100 associated with the region. PLCs 94 (similar in all respects to above-described PLCs 92) are provided to connect any of conductors 90 and 100 to selected leads 174 to make these asynchronous clock and/or clear signals available. Although two PLCs 94 are shown in FIG. 3, a larger number (such as four) is preferred.

The signals on leads 174 are applied to programmable inversion and buffering circuitry 230. This circuit buffers each applied signal, and may also invert any applied signal under programmable control. The output signals of circuit 230 are made available to each logic module 30 in the region via conductors 220.

The main output logic signal 38 of each logic module 30 in a region 20 can be applied (via programmably controlled tri-state drivers 240 and leads 241) to either or both of two conductors 80 associated with the column that includes that region. The output signal 38 of each logic module in a region can alternatively or additionally be applied (via PLCs 242 (multiplexers in the presently preferred embodiment) and programmably controlled tri-state drivers 244) to one of conductors 60 and/or to one of conductors 70 associated with that region. The other inputs to each of PLCs 242 (i.e., on the leads designated 82 or 84 in FIG. 3) are signals from several of the conductors 80 associated with the region. Thus any of PLCs 242 and drivers 244 can alternatively be used to apply a signal on a conductor 80 to a conductor 60 or 70 associated with the region. The inputs 82/84 from conductors 80 to PLCs 242 are distributed over conductors 80. Similarly, the outputs from drivers 240 are distributed over conductors 80, and the outputs from drivers 244 are distributed over conductors 60 and 70.

For simplicity FIGS. 1–3 all assume that the regions 20 in each column are uniquely associated with the conductors 80 adjacent to that column and with the elements 240, 242, and 244 adjacent to the regions in that column. In the preferred embodiment, however, the outputs 38 of the logic modules in each column can in fact be shifted to an adjacent column, if desired, for either of two distinct purposes. The first of these purposes is to use a spare column of regions 20s to make up for a defect in another regular column. The second of these purposes is to swap the outputs of two adjacent columns to increase the flexibility with which outputs 38 can be introduced to conductors 60, 70, and 80. Representative circuitry for performing these two different kinds of column shifts of logic module outputs is shown in FIG. 4.

Figure 4:
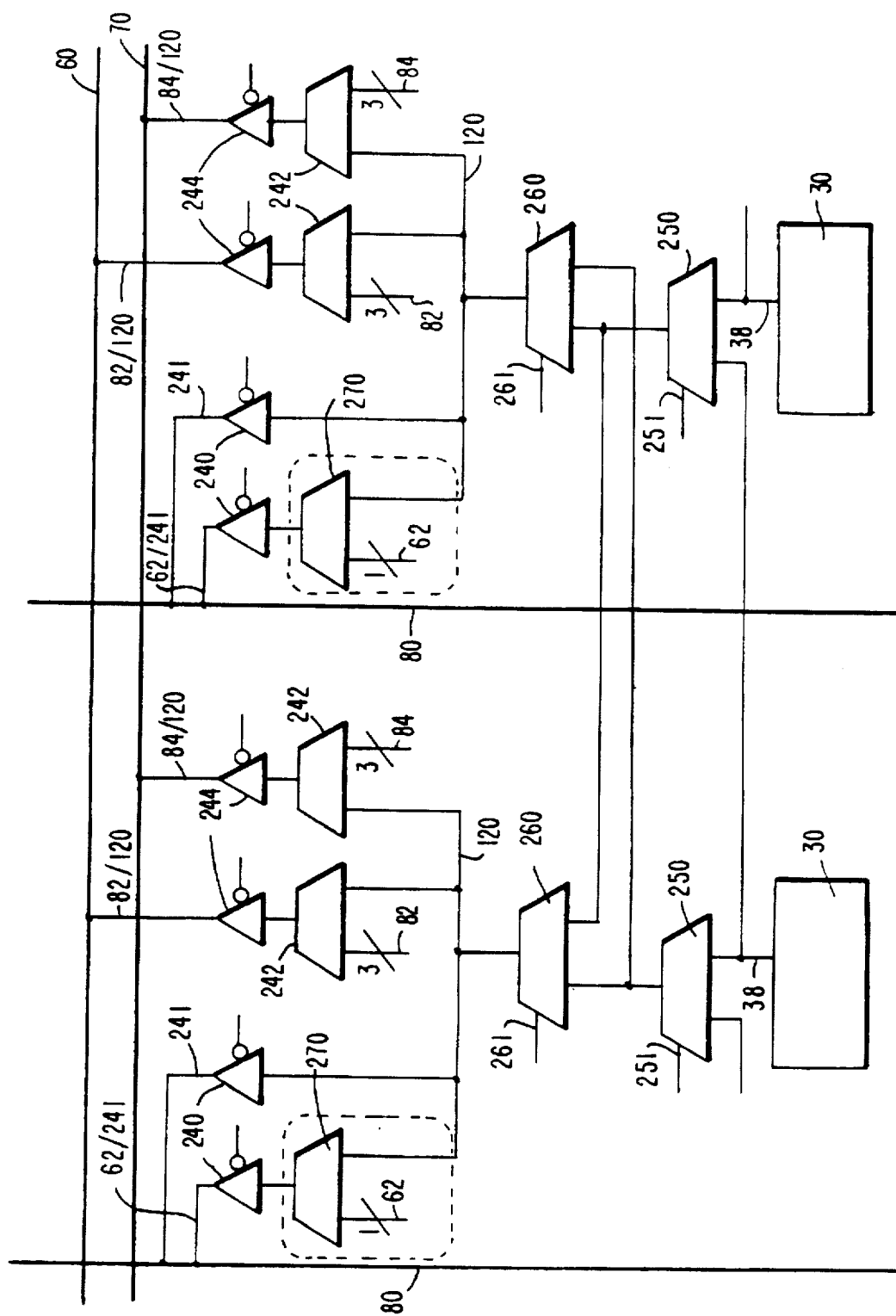
FIG. 4 is another more detailed, but still simplified, schematic block diagram of a representative portion of the apparatus of FIG. 1.

FIG. 4 shows one representative logic module 30 from each of two adjacent columns. These two logic modules are therefore horizontally adjacent to one another. The output 38 from the left-hand logic module is applied to one input of the redundancy PLC 250 (a multiplexer in the presently preferred embodiment) in the associated column, and also to one input of the similar redundancy PLC 250 in the column to the right. The other input to the PLC 250 in the left-hand column is a similar logic module output 38 from the column to the left of the columns shown in FIG. 4. The other input to the PLC 250 in the right-hand column is the output 38 from the depicted logic module in that column, and that logic module output is also applied to one input of the PLC 250 in the column to the right of the depicted columns. Each of PLCs 250 is controlled (via the associated control lead 251) by an associated FCE (a fuse in the presently preferred embodiment). PLCs 250 are controlled so that the logic module outputs 38 of a column containing a defect can be replaced by the outputs 38 of the column to the left of the defective column. The outputs of all columns to the left of a defective column are shifted right one column, and the spare column to the left of a defective column is put to use to make up for loss of the defective column. These column shifts are, however, confined to each of the two halves (left/right) of the device. In other words, there is no shifting from one side of the column of RAM regions 40 to the other side of that column.

The output of the redundancy PLCs 250 in the left-hand column in FIG. 4 is applied to one input terminal of the programmable swap PLC 260 (a multiplexer in the presently preferred embodiment) in that column and to one input terminal of the similar swap PLC 260 in the column to the right. The output of the redundancy PLC 250 in the right-hand column in FIG. 4 is applied to the other input terminal of the swap PLC 260 in the right-hand column, as well as to the other input terminal of the swap PLC 260 in the left-hand column. PLCs 260 are controlled via leads 261 by FCEs on device 10. It will therefore be apparent that the PLCs 260 in two adjacent columns that are paired by cross-connected PLC 250 outputs as shown in FIG. 4 allow the logic module outputs of those two columns to be swapped if desired. In particular, because the outputs of drivers 244 in the left-hand column in FIG. 4 are connected to different conductors 60 and 70 than the outputs of drivers 244 in the right-hand column, swap PLCs 260 double the choices available for connection of each logic module output signal 38 to conductors 60 and 70. Similarly, because the outputs of drivers 240 in the left-hand column in FIG. 4 are connected to different conductors 80 than drivers 240 in the right-hand column, swap PLCs 260 also double the choices available for connection of each logic module output signal 38 to conductors 80.

Figure 18:
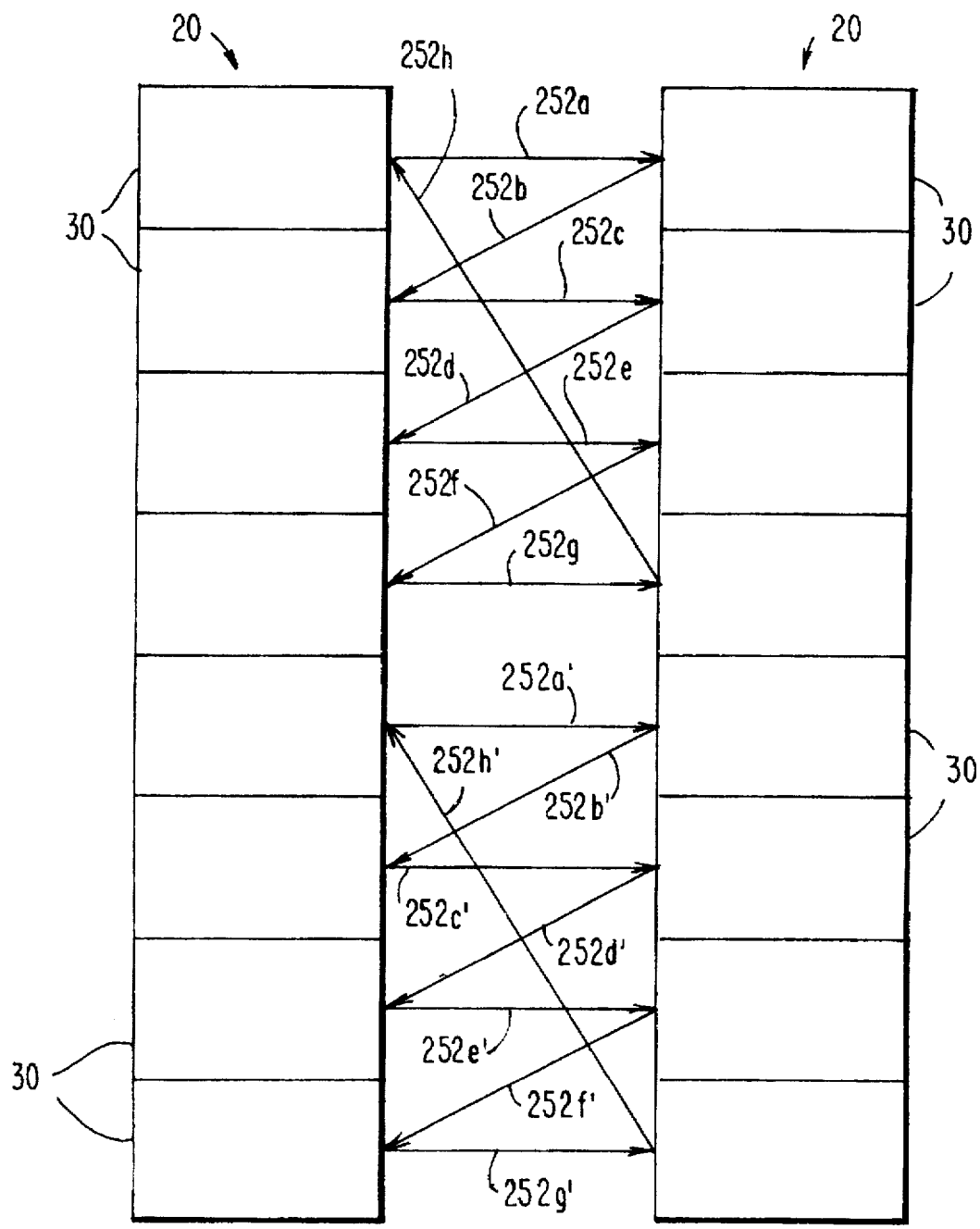
FIG. 18 is a simplified block diagram showing an illustrative alternative embodiment of a portion of FIG. 4.

As a possible alternative to swap PLCs 260 in directly horizontally adjacent logic modules being paired as shown in FIG. 4, more mixing can be built into the swap PLC logic by having each swap PLC receive its second input from a first other logic module, while the primary input to that swap PLC is also directed (as a second input) to the swap PLC in a second other logic module. All of the swap PLC exchanges in this alternative are preferably between logic modules in horizontally adjacent blocks, but they are not all between directly horizontally adjacent logic modules. An illustrative embodiment of this alternative is shown in FIG. 18. In this embodiment the output 252a of the redundancy PLC 250 in the logic module 30 shown in the upper left is one of the inputs to the swap PLC 260 in the logic module 30 in the upper right. The output 252b of the redundancy PLC 250 in the upper right logic module 30 is one of the inputs to the swap PLC 260 in the second logic module 30 on the left. The output 252c of the redundancy PLC 250 in the second logic module 30 on the left is one of the inputs to the swap PLC 260 in the second logic module 30 on the right. The output 252d of the redundancy PLC 250 in the second logic module 30 on the right is one of the inputs to the swap PLC 260 in the third logic module 30 on the left. The output 252e of the redundancy PLC 250 in the third logic module 30 on the left is one of the inputs to the swap PLC 260 in the third logic module 30 on the right. The output 252f of the redundancy PLC 250 in the third logic module 30 on the right is one of the inputs to the swap PLC 260 in the fourth logic module 30 on the left. The output 252g of the redundancy PLC 250 in the fourth logic module 30 on the left is one of the inputs to the swap PLC 260 in the fourth logic module 30 on the right. The output 252h of the redundancy PLC 250 in the fourth logic module 30 on the right is one of the inputs to the swap PLC 260 in the first logic module 30 on the left. This pattern is repeated for the four lower logic modules 30 in the two depicted adjacent logic regions 20, with "prime" designations being added to the reference members.

It will be understood from FIG. 4 that although PLCs 250 and 260 are not shown in FIG. 3, they are in fact interposed between the logic module outputs 38 and elements 240 and 242 in FIG. 3.

FIG. 4 also shows more detail as to how connections 62 in FIG. 2 are implemented. Four of the eight logic modules 30 in each region 20 have an associated programmable PLC 270 (a multiplexer in the presently preferred embodiment) as shown in FIG. 4. Thus there are four PLCs 270 associated with each region 20. Each PLC 270 allows either a logic module output signal 120 or the signal 62 on one of adjacent conductors 60 to be applied to the associated driver 240 and thereby to one of associated conductors 80.

Figure 5:
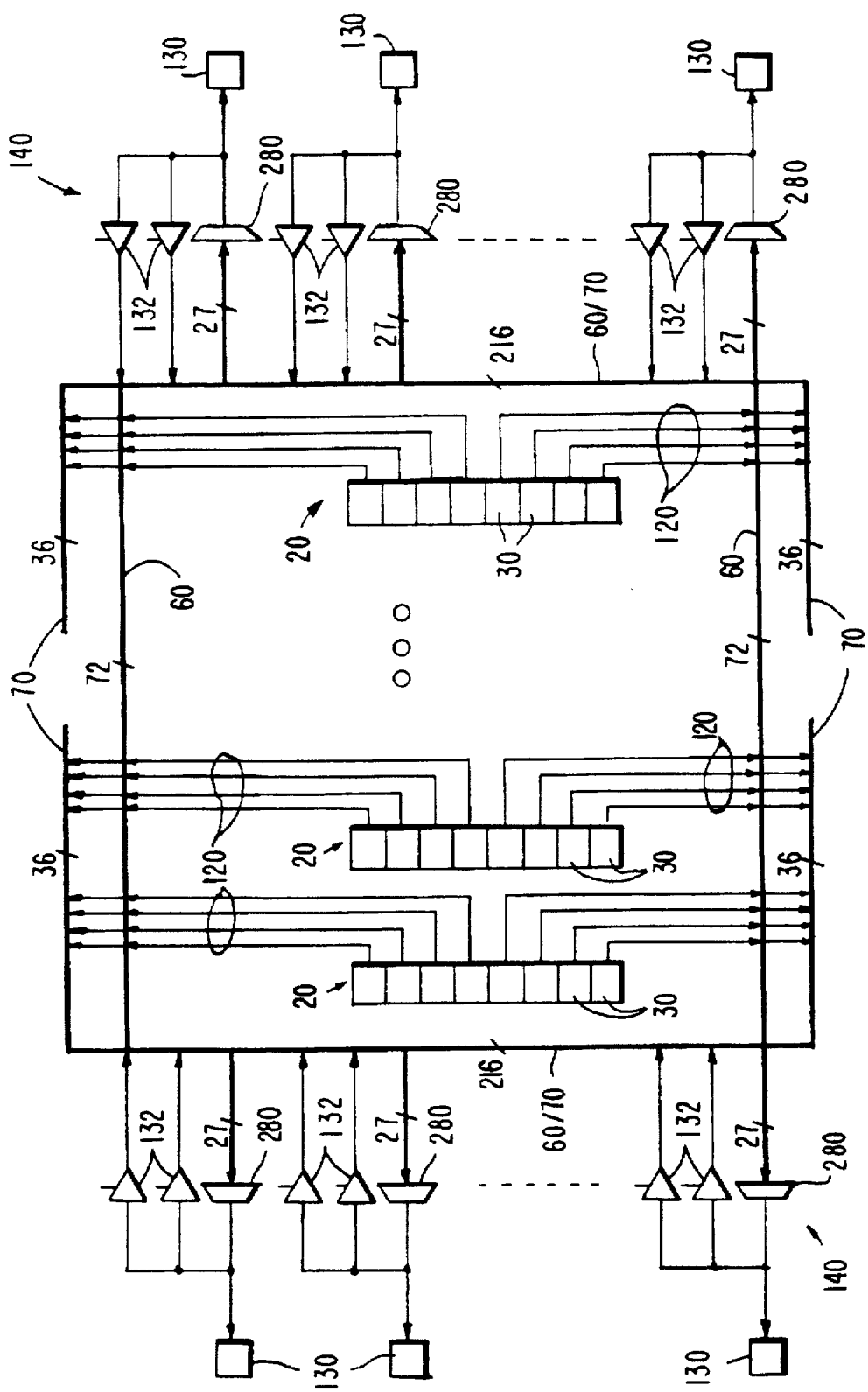
FIG. 5 is another more detailed, but still simplified, schematic block diagram of a representative portion of the apparatus of FIG. 1.

FIG. 5 shows some additional aspects of the connections to and from the conductors 60 and 70 for a typical row. As mentioned in connection with FIG. 1, each row has eight associated input/output pins 130 adjacent each end of the row. Also there are 144 conductors 60 and 72 conductors 70, for a total of 216 conductors 60/70 at each end of each row. (Each conductor 60, of course, appears at both ends of the associated row. Thus each conductor 60 is connectable to a pin 130 at either end of its row.) The conductors 60/70 at each end of a row are divided into eight different groups of 27 conductors each, and the conductors in each such group are applied to the 27 inputs of a respective one of PLCs 280 (27 to 1 multiplexers in the presently preferred embodiment). Each PLC 280 can select one of its inputs for application to an associated input/output pin 130 when that pin is to be used as a chip output.

For use of pins 130 as chip inputs, the signal on each pin 130 is applied to the inputs of two associated, programmable, tri-state drivers 132, the outputs of which are applied to different ones of conductors 60 in the row associated with that pin 130.

FIG. 5 also shows again that in each row half of the conductors 60 and 70 are above the logic regions 20 of that row, and the other half of conductors 60 and 70 are below those logic regions. And, as FIG. 5 shows, the upper four logic modules 30 in each region in a row supply their output signals 38 or 120 to the conductors 60/70 that are above the row, while the lower four logic modules in each region supply their output signals 38 or 120 to the conductors 60/70 that are below the row.

FIG. 6 has already been partly considered but will now be more fully discussed. As has been mentioned, there is a so-called peripheral bus that extends in a closed loop around the periphery of device 10. This peripheral bus includes the two dedicated clock signal conductors 190, six output enable conductors 210 (numbered 0 through 5, respectively), and six clock enable conductors 212 (numbered 0 through 5, respectively). Conductors 210 and 212 can be driven by the conductors 60 associated with each row that are drivable by the top-most logic module 30 in each region 20 in that row. Numbering the rows 0 through 9 from top to bottom, the following table shows the peripheral bus signals that are derivable from each row (where OE stands for output enable and CLKENB stands for clock enable):

TABLE 1

| Row Number | Peripheral Bus Signal(s) |
| --- | --- |
| 0 | OE0 |
|   | CLKENB0 |
| 1 | OE1 |
| 2 | CLKENB1 |
| 3 | OE2 |
| 4 | CLKENB2 |
| 5 | OE3 |
| 6 | CLKENB3 |
| 7 | OE4 |
| 8 | CLKENB4 |
| 9 | CLKENB5 |
|   | OE5 |

FIG. 6 shows the circuitry associated with representative rows for deriving the output enable and clock enable signals as in the foregoing table. This circuitry is exactly duplicated at both ends of each row to reduce signal propagation delay to and on the peripheral bus. Only one end of each row needs to be actually considered in connection with the following discussion.

Considering first the top-most row (row 0 in Table 1), the 18 conductors 60 that can receive output signals from the top logic module 30 of each region in the row are applied to PLCs 290 and 292 (22 to 1 multiplexers in the presently preferred embodiment) associated with that row. The four fast conductors 170 are also applied to those PLCs. PLCs 290 select one of their inputs as the OE0 signal and apply that signal (via drivers 294) to OE0 peripheral bus conductor 210. PLCs 292 similarly select one of their inputs as the CLKENB0 signal and apply that signal (via drivers 296) to the CLKENB0 peripheral bus conductor 212.

In the second row the 18 conductors 60 that can receive the output signal of the top-most logic module 30 of each region in the row are connected to PLCs 290. The four fast conductors 170 are also connected to those PLCs. PLCs 290 select one of the applied signals for application (via drivers 294) to the OE1 peripheral bus conductor 210.

The next to last row shown in FIG. 6 is row 8. The PLCs 292 in that row receive the 18 conductors 60 that can carry the top-most logic module output signals of that row and the four fast conductors 170. PLCs 292 select one of these inputs as the CLKENB4 signal, which is applied via drivers 296 to the appropriate peripheral bus conductor 212.

The bottom row shown in FIG. 6 is row 9. It is similar to the top row (row 0), except that the output of PLCs 290 is the OE5 signal and the output of PLCs 292 is the CLKENB5 signal.

FIG. 6 also shows how the various peripheral bus signals are used in input/output cells associated with input/output pins 130 and 150. Representative circuitry 300 for generating an output enable signal, a clock signal, a clock enable signal, and a clear signal used in an input/output cell associated with an input/output pin 130 or 150 is shown in FIG. 6. PLC 302 (a 9 to 1 multiplexer in the presently preferred embodiment) receives the six output enable signals from conductors 210, one signal from a conductor 60 or 70 from the row associated with the pin 130 served by that circuity 300 (or from a conductor 80 from the column associated with the pin 150 served by that circuitry 300), and the CLKENB0 and CLKENB1 signals from conductors 212. PLC 302 selects one of these nine inputs as the output enable signal of the associated input/output cell. Because one of the inputs to each PLC 302 is a conductor 60, 70, or 80 associated with the row or input/output he associated input/output pin 130 or 150 is associated with, each input/output pin 130 and 150 can have its own unique output enable signal. PLC 304 (a 4 to 1 multiplexer in the presently preferred embodiment) receives the CLK0 and CLK1 signals from conductors 190, and the CKLENB0 and CLKENB5 signals from conductors 212. PLC 304 selects one of these signals as the clock signal of circuitry 300. PLC 306 (a 7 to 1 multiplexer in the presently preferred embodiment) receives the six clock enable signals from conductors 212 and one signal from a conductor 60/70 or a conductor 80, depending on whether circuitry 300 serves a pin 130 or a pin 150. PLC 306 can select one of its inputs as the clock enable signal of circuitry 300. Again, because one of the inputs to each PLC 306 is a conductor 60, 70, or 80 associated with the row or column that the associated input/output pin 130 or 150 is associated with, each input/output pin 130 and 150 can have its own unique clock enable signal. Lastly, PLC 308 (a 2 to 1 multiplexer in the presently preferred embodiment) receives the CLKENB2 and CLKENB4 signals from conductors 212, and can select either of these two signals as the clear signal of circuitry 300.

Figure 7:
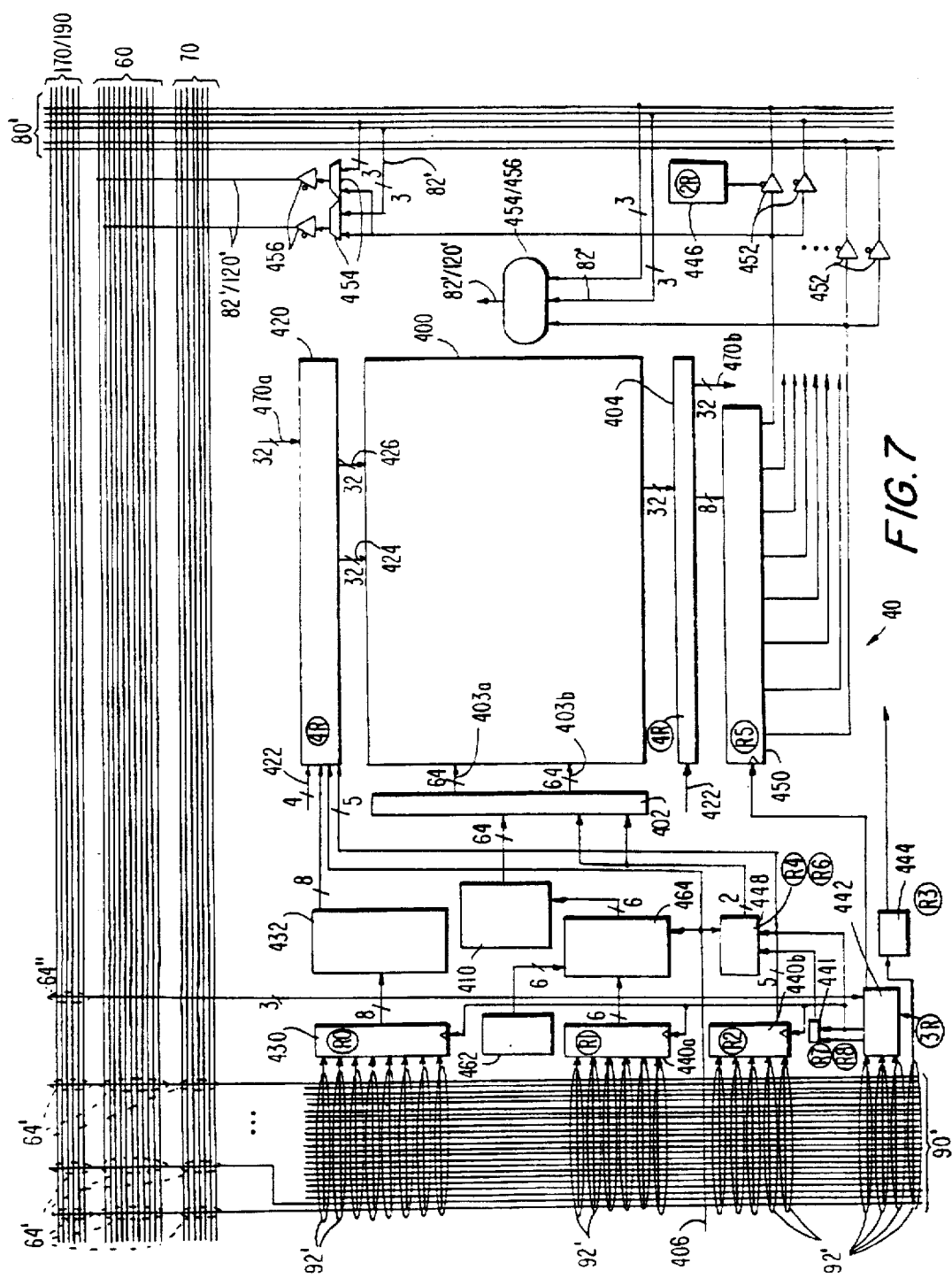
FIG. 7 is another more detailed, but still simplified, schematic block diagram of a representative portion of the apparatus of FIG. 1.

FIG. 7 shows a typical RAM region 40 in more detail, there being one such RAM region associated with each row. Each RAM region 40 includes 2048 bits of random access memory. These RAM bits are organized in a 64×32 array 400, which can be reconfigured as a 256×8, 512×4, 1024×2, or 2048×1 memory. Array 400 can be used as a static random access memory (SRAM) or as a read-only memory (ROM). Each memory cell (which can be implemented as described above for FCEs) can be accessed through a row decoder 410 and a column decoder 420. The RAM region 40 needs a maximum of 11 address signals, eight data signals, a read-write control signal, two clock signals, and an output enable signal in order to operate.

The interface of RAM region 40 to the remainder of the chip is very similar to the interface for a regular logic region 20. RAM region 40 has 22 region feeding conductors 90' for bringing signals into the region from the row conductors 60 associated with the row that includes the RAM region and also from the half-row conductors 70 associated with left half of that row. Each of these conductors 60 and 70 has four chances to route into the RAM region via PLCs 64' (as compared to two chances in a regular logic region 20). PLCs 64' also allow fast conductors 170 and dedicated clock conductors 190 to feed conductors 90'. The input PLCs 92' to the RAM region are fully populated. The clock and read-write control signals (applied to programmable clock and read-write control circuit 442) can be generated either from the conductors 90' or more directly from conductors 170 and 190 via PLCs 64 ". Control circuit 442 makes this selection, and is also programmable to invert any of the selected signals. The read-write control signal output by circuit 442 is applied to read/write control block 448 via register/bypass circuit 441. Circuit 441 is programmable to either register the read-write control signal or to pass that signal through without registration. The "input" clock signal output by circuit 442 is applied to the clock input terminals of registers 430, 440a, 440b, 441, and 448. The "output" clock signal output by circuit 442 is applied to register 450. The "output" clock signal can be the same as the "input" clock signal, or it can be independent of the "input" clock signal. The output enable signal is applied to tri-state control logic elements 446 via register/bypass circuit 444 to possibly control elements 446 as is more fully described below. Circuit 444 is programmable to either register the output enable signal or to pass that signal through without registration.

RAM region 40 can be programmed to operate either in synchronous or asynchronous mode. In synchronous mode all data lines, address lines, and RAM outputs are registered by data register 430, address registers 440a/b, and RAM output register 450, respectively. Thus each of registers 430, 440a, 440b, and 450 is programmable to either register the applied signals or to pass those signals through unregistered.

Register 430 receives as many as eight data signals from associated PLCs 92'. The data output signals of register 430 are buffered by buffers 432 and applied to column decoder and data selection and control logic 420. Control logic 420 also receives via leads 422 the outputs of four FCEs which control whether RAM region 40 will function as an eight-bit-wide, four-bit wide, two-bit-wide, or one-bit-wide memory. (These four signals 422 are also applied to RAM data output selection circuit 404.) Control logic 420 also receives a programming mode control signal via lead 406, and the five most significant address bits from register 440b. (For use during programming mode operation of the device, control logic 420 also receives 32 programming data input signals via leads 470a as will be described in more detail below.) Control logic 420 produces on leads 424 address signals and on leads 426 data signals appropriate to the storage in RAM array 400 of one, two, four, or eight bits of data, depending on the memory configuration selected by the signals on leads 422.

Register 440a receives the six least significant address bits from associated PLCs 92'. The output signals of register 440a are applied to address control block 464. Control block 464 also receives six output signals from preload down counter 462, which is usable during programming mode to supply sequential RAM addresses to facilitate storage in the RAM of data that will subsequently be ROM data. Control block 464 selects one of the two groups of six inputs it receives, depending on whether the device is in programming mode as indicated by the signal on above-mentioned lead 406. The six outputs of control block 464 are applied to row decoder 410, which produces one of 64 outputs applied to address multiplexing circuit 402. Circuit 402 makes a one-of-64 selection to select one of the 64 rows of RAM array 400 that is to receive or output data.

Register 440b receives the five most significant address bits from associated PLCs 92'. As has been mentioned, the five address bits received by register 440b are applied to column decoder and data selection and control logic 420 for use in selecting the column or columns in RAM array 400 that is or are to receive or output data. The write enable signal is applied from register/bypass circuit 441 to programmable read/write control block 448, which produces read enable and write enable signals that are applied to address multiplexing circuit 402. Circuit 402 applies to RAM array 400 one of 64 read address signals 403a or one of 64 write address signals 403b, depending on whether reading or writing is enabled.

As has been said, RAM region 40 has 11 address lines, eight data lines, a read-write control line, two clock lines, and an output enable line. RAM array 400 can be configured as a 2K×1, 1K×2, 512×4, or 256×8 memory. There are four FCEs 422 to control these different configurations. The following table lists the address lines and data lines required under the four conditions identified above:

TABLE 2

|  | 2K × 1 | 1K × 2 | 512 × 4 | 256 × 8 |
| --- | --- | --- | --- | --- |
| Address lines: | 11 | 10 | 9 | 8 |
| Data lines: | 1 | 2 | 4 | 8 |
| Read-Write Control: | 1 | 1 | 1 | 1 |
| Clocks and Output Enable: | 3 | 3 | 3 | 3 |
| Total: | 16 | 16 | 17 | 20 |

If the "by 8" mode is selected (right-most column in Table 2), the three most significant address lines are automatically tied high. If the "by 4" mode is selected (next-to-right-most column in Table 2), the two most significant address lines are automatically tied high. If the "by 2" mode is selected (next-to-left-most column in Table 2), the most significant address line is automatically tied high.

RAM data output selection circuit 404 has 32 inputs, one from each column of RAM array 400. Circuit 404 also receives the four control inputs 422 described above. During normal operation of the device (as distinguished from programming mode operation) circuit 404 applies the data it receives from RAM array 400 to RAM output register 450 in a format determined by inputs 422 (i.e., a one-bit, two-bit, four-bit, or eight-bit format). Register 450 outputs the data it receives in the same format. (During programming mode operation circuit 404 simply passes its 32 inputs through to its 32 outputs 470b.)

To increase the depth or width of the RAM memory, the RAM regions 40 in two or more rows can be cascaded together. For example, to provide a 2K×8 memory, eight 2K×1 blocks can be used in parallel. This means using the RAM regions 40 in eight rows. Each row would contain a one-bit slice or byte of the eight-bit word, and the data from the eight rows would collectively provide the eight-bit word. Alternatively, a 256×8 configuration can be chosen for each of eight rows. Each row would produce an eight-bit byte or word which could be multiplexed with eight-bit bytes or words from the other rows. The multiplexing would be done in logic regions 20, and the high order RAM region address bits would control the multiplexing. Using all ten rows of RAM regions 40, the maximum memory depth possible is 20K (in a 20K×1 memory), and the maximum width possible is 80 bits (in a 256×80 memory). The following table lists some of the possible combinations with the different building blocks:

TABLE 3

2K × 1 as building block:
    2K × 1, 2K × 2, 2K × 3, . . ., or 2K × 10;
    4K × 1, 6K × 1, 8K × 1, . . ., or 20K × 1
1K × 2 as building block:
    1K × 2, 1K × 4, 1K × 6, . . ., or 1K × 20;
    2K × 2, 3K × 2, 4K × 2, . . ., or 10K × 2;
512 × 4 as building block:
    512 × 4, 512 × 8, 512 × 12, . . ., or 512 × 40;
    1K × 4, 1.5K × 4, 2K × 4, . . ., or 5K × 4
256 × 8 as building block:
    256 × 8, 256 × 16, 256 × 24, . . ., or 256 × 80;
    512 × 8, 768 × 8, 1K × 8, . . ., or 2.5K × 8

Returning to the discussion of synchronous vs. asynchronous mode, the selection of synchronous mode is controlled by the read-write control signal. If the read-write control signal is registered by circuit 441, then the RAM region is in synchronous mode. In synchronous mode the RAM region supports multiple read/write with continuous clock. For write operation the read-write control signal is held low, a new address is decoded during "input" clock high time (from circuit 442), and data is written into the RAM cells during the "input" clock low time. For read operation, the read-write control signal is held high, the data is read out on the rising edge of the "output" clock signal (from circuit 442) if the output is registered, or the data is read out directly if the output is bypassed.

In asynchronous mode the read-write control register 441 is bypassed and the "input" clock from circuit 442 is not used. The writing and reading of data into the RAM cells is controlled purely by the read-write control signal. During the write cycle the read-write control signal is held low and the RAM cells addressed will be written. The address signals are not allowed to change when the read-write control signal is low. During the read cycle, the read-write control signal is held high and the contents of the RAM cell addressed is read out. The address signals can be changed only when the read-write control signal is high.

As has been mentioned, RAM regions 40 can be operated as either an SRAM array which can be written to and read from dynamically, or as a ROM array with read-only access. Each RAM cell can be accessed through row decoder 410 and column decoder 420. Row decoder 410 takes the six least significant address bits from 11 address bits, and column decoder 420 takes the five most significant bits from the 11 address bits. To write data into the RAM cell synchronously the read-write control signal is held low and on the falling edge clock the data will be written into the addressed RAM cell. To read data out of the RAM cell synchronously the read-write control signal is held high and on the rising edge of the clock the data is read out of the addressed RAM cell. In asynchronous mode read-write control signal register 441 is bypassed. The writing and reading of data into the RAM cells is controlled by the read-write control signal only. When the read-write control signal is low, the location addressed by the address lines is written to. Data is read out of the addressed locations when the read-write control signal is held high.

To use the RAM regions as a ROM, data is written into the memory cells during programming of the chip. During programming, six-bit preload down counter 462 counts down sequentially from 3F (hexadecimal) to 00 (hexadecimal). The six outputs of counter 462 are fed to row decoder 410 to generate the row address while all column decoder 420 outputs are held high so that the 64×32 array 400 is programmed like a first-in- first-out (FIFO) chain. The programming data is supplied via 32 programming data leads 470a which come from the RAM region 40 of the preceding row. The chain of programming data leads continues via leads 470b to the RAM region 40 in the next row. After programming, the RAM regions act like a ROM if the read-write control signal is held permanently high to force the memory into read mode only.

There are 24 vertical conductors 80' associated with the column of RAM regions 40. Each RAM region 40 has 16 tri-state drivers 452 for selectively driving various ones of these vertical conductors 80'. Thus each RAM region output (from register 450) can drive either or both of two of vertical conductors 80'. Each driver 452 is controlled by associated tri-state control logic 446. Each of circuits 446 is controlled in turn by the user tri-state output enable signal from element 444 and two other programmable bits. Each driver 452 has three states: always on, always off, and tri-state. The user tri-state control has been provided as a means of having multiple blocks of RAM driving the same set of conductors 80'. This can be used for building "ping-ponging" type RAM, where one block outputs its data and then is switched off so another block can be switched on and output its data onto the same conductors 80'.

There are also 16 programmable tri-state drivers 456 associated with each RAM region 40 for selectively applying the RAM output signals to the horizontal conductors 60 associated with the row that includes that RAM region. Thus each RAM output can be applied to either or both of two conductors 60. (These are the programmable connections identified as 120' in other FIGS. such as FIG. 2.) Each driver 456 can alternatively be used to apply the signal on any of three conductors 80' to the conductor 60 driven by that driver. (These are the programmable connections identified as 82' in other FIGS. such as FIG. 2.) PLCs 454 (multiplexers in the presently preferred embodiment) select which signal the associated driver 456 will apply to the driven conductor 60.

In accordance with the present invention the 16 input/output pins 130 associated with each row are preferably connected to 32 of the 144 conductors 60 associated with that row (see especially FIG. 5) so that the following constraints or goals are satisfied:

1. Each input/output pin 130 feeds two conductors 60.
2. At least one conductor 60 per input/output pin 130 should feed peripheral signal PLCs 292 (FIG. 6).
3. The number of logic region pairs that can also drive the 32 conductors 60 that are drivable by input/output pins 130 should be evenly distributed among these 32 conductors 60. As mentioned above in connection with FIG. 4, logic regions 20 are "paired" by cross-connected PLCs 260. Thus there are 18 such pairs of logic regions in each row. The outputs from these 18 pairs of logic regions that go to the 32 conductors 60 drivable by input/output pins 130 should be evenly divided among those 32 conductors.
4. An input/output pin 130 may not feed a conductor 60 that 130 via the same input/output pin 130 via the PLC 280 (FIG. 5) associated with that input/output pin.
5. The number of input/output pins 130 that can get to the same region feeding conductor 90 associated with any logic region 20 should be minimized.
6. The pattern in which the input/output pins 130 associated with a row are connected to feed the conductors 60 associated with that row should be the same for every row.
7. The two conductors 60 drivable by an input/output pin 130 should not both be drivable by the same pair of logic regions 20. Again, the concept of paired logic regions is as recapitulated above in connection with point 3.

An example of a pattern of programmable connections which substantially satisfies these constraints or goals is shown in FIG. 11. This FIG. is further explained below.

Satisfying the foregoing constraints or goals in relation to selecting which of conductors 60 is drivable by each of input/output pins 130 helps to improve the availability of signal routing through the circuit, thereby reducing the instances in which connections needed by a user of the device to perform logic cannot be made (either because interconnection resources of a particular type have been prematurely exhausted or because desired connections are blocked by previously made connections). It may not be necessary in all instances to satisfy all of the foregoing constraints or goals, but the more of these items that are satisfied, the better the routability of the resulting chip.

Further in accordance with this invention, to improve usability of RAM regions 40, the eight RAM region outputs per row are preferably connected to feed the 24 vertical conductors 80' (see especially FIG. 7) so that the following constraints or goals are satisfied:

1. Each RAM output (i.e., each output of a register 450) feeds two conductors 80'.
2. Each of the following RAM configurations should be possible from the point of view of availability of connections to conductors 80' and 60:
   a. 2048×10 bit RAM (i.e., ten RAM blocks of 2048×1 bit) feeding the conductors 60 associated with one row;
   b. 1024×16 bit RAM (i.e., eight RAM blocks of 1024×2 bits) feeding the conductors 60 associated with one row;
   c. 512×16 bit RAM (i.e., four RAM blocks of 512∴4 bits) feeding the conductors 60 associated with one row;
   d. 256×16 bit RAM (i.e., two RAM blocks of 256×8 bits) feeding the conductors 60 associated with one row;
   e. two 1024×10 bit RAM (i.e., two groups each with five RAM blocks of 1024×2 bits) respectively feeding the conductors 60 associated with two separate rows;
   f. two 512×12 bit RAM (i.e., two groups each with three RAM blocks of 512×4 bits) respectively feeding the conductors 60 associated with two separate rows; and
   g. three 256×8 bit RAM (i.e., three groups of 1 RAM block of 256×8 bits) respectively feeding the conductors 60 associated with three separate rows.
3. To satisfy the foregoing conditions, the pattern with which the RAM outputs of each row are connected to conductors 80' will be different in every row.

Figure 12A:
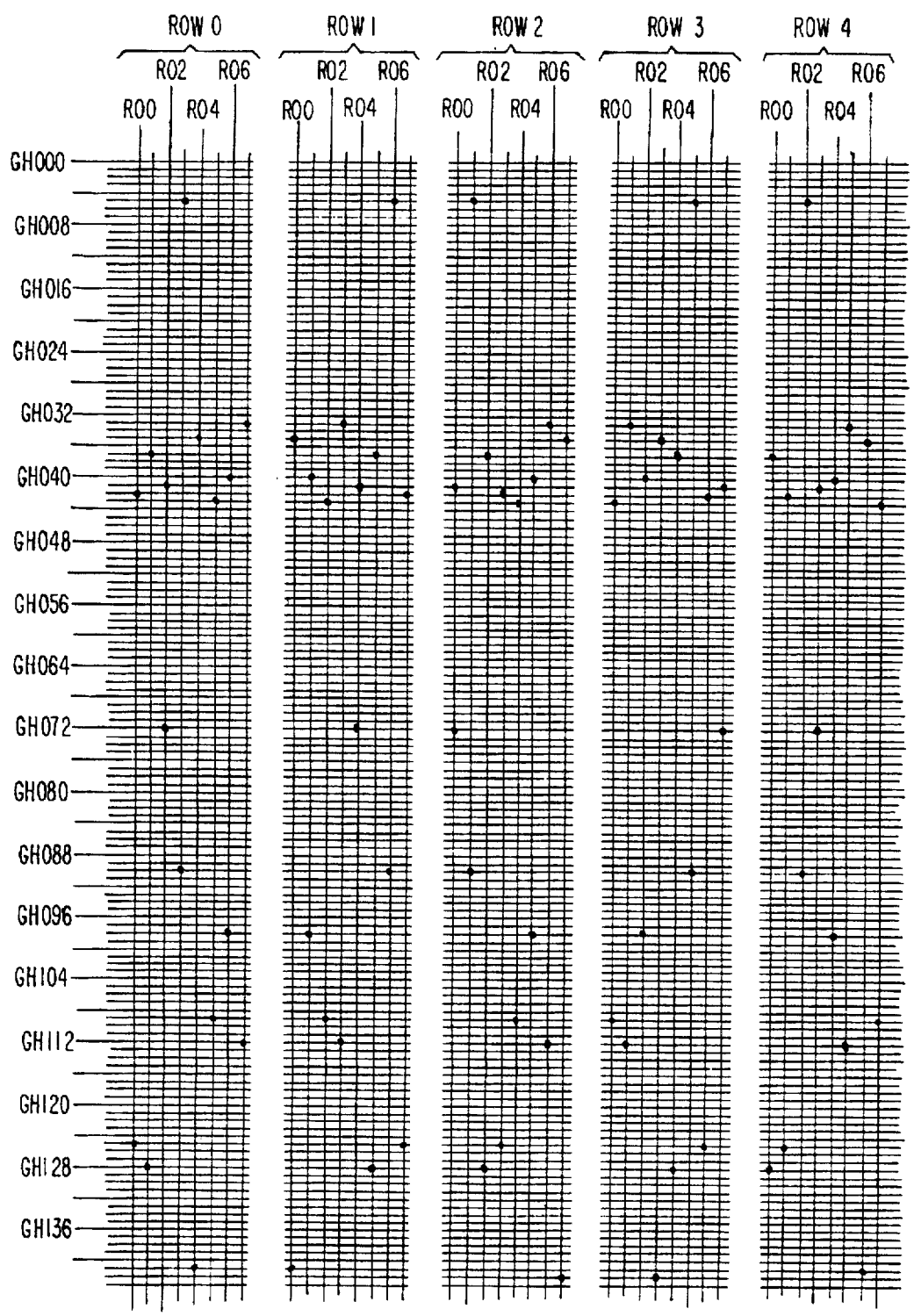
FIGS. 12a and 12b are schematic diagrams showing other representative portions of an illustrative pattern of programmable connections in accordance with the principles of this invention.
Figure 12B:
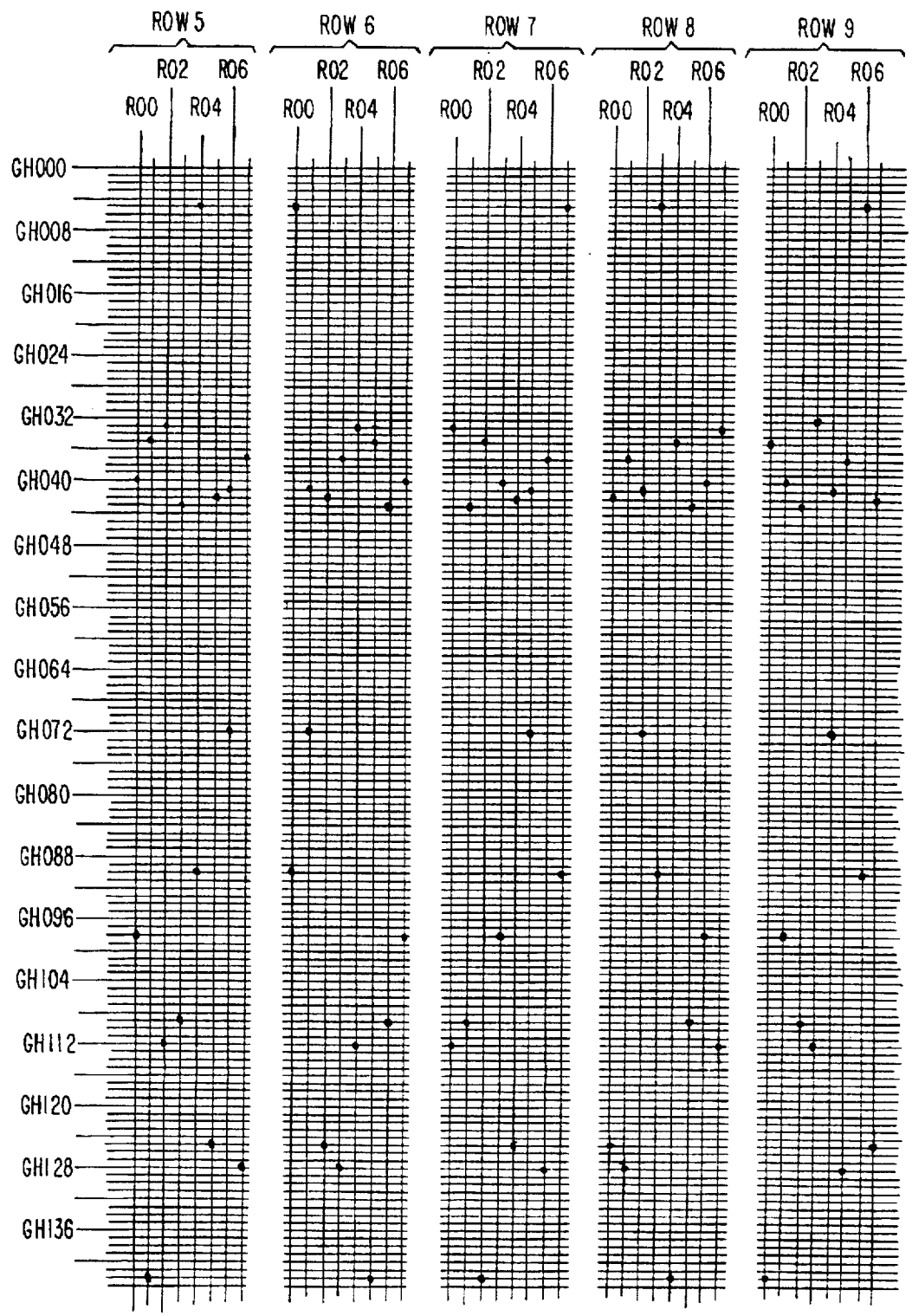

An example of a pattern of programmable connections which substantially satisfies these constraints or goals is shown in FIGS. 12a, 12b, and 13. These FIGS. are further explained below.

Once again, satisfying the foregoing constraints or goals in relation to selecting which of conductors 80' is drivable by each output of each register 450 helps improve the flexibility with which RAM regions 40 can be used as shown, for example, in Table 3. Other RAM configurations in Table 3 reduce to the items listed above, and so if the above-listed items are possible, many other useful RAM configurations are also possible. It may not be necessary to satisfy every one of the above-listed constraints or goals with every embodiment. But the more of these items that are satisfied, the greater the flexibility with which the RAM regions can be used.

Still further in accordance with this invention, to improve routability in the device, the 288 PLCs 260 (FIG. 4) per row are preferably connected to feed the 144 conductors 60 per row and the 72 conductors 70 per half row so that the following constraints or goals are satisfied:

1. Each PLC 260 feeds one conductor 60 and one conductor 70.
2. The top four logic modules 30 in each logic region 20 in a row must feed the conductors 60 and 70 above the row, while the bottom four logic modules must feed the conductors 60 and 70 below the row.
3. The top-most logic module 30 in each logic region 20 in a row must feed the 18 conductors 60 that are immediately above the row (to facilitate application of those signals to the PLCs 292 (FIG. 6) that drive peripheral conductors 210 and 212).
4. Seven of the eight logic modules 30 in each logic region 20 should not be able to get to the same region feeding conductor 90 via PLCs 260 and conductors 60. The eighth logic module 30 in each region 20 should share a region feeding conductor 90 with only one or two other logic modules.
5. Same as for item 4 but applied to PLCs 260 and conductors 70.

An example of a pattern of programmable connections which substantially satisfies these constraints or goals is shown in FIG. 14a–c and 15a–c. These FIGS. are further explained below.

Again, it may not be necessary to satisfy all of the foregoing constraints or goals in every embodiment, but the more of these items that are satisfied, the better routability in the device will be.

To additionally improve routability in accordance with this invention the 144 conductors 60 associated with each row and the 72 conductors 70 associated with the left half of each row are preferably connected to feed the 22 memory feeding conductors 90' (FIG. 7) associated with that row so that the following constraints or goals are satisfied:

1. Each conductor 60 or 70 feeds four memory feeding conductors 90'.
2. The conductors 60 and 70 are separated into two groups, and no more than two conductors from a given group can feed the same memory feeding conductor 90'.
3. A subset of the pattern of the connections from conductors 60 and 70 to conductors 90' should be identical to the pattern of connections from conductors 60 and 70 to conductors 90.
4. Each conductor 60 and 70 should feed a unique group of four conductors 90'.
5. No two conductors 60 and 70 should share more than two memory feeding conductors 90' as destinations.
6. The pattern of connections between conductors 60 and 70 and conductors 90' should be the same for all rows.

Figure 16:
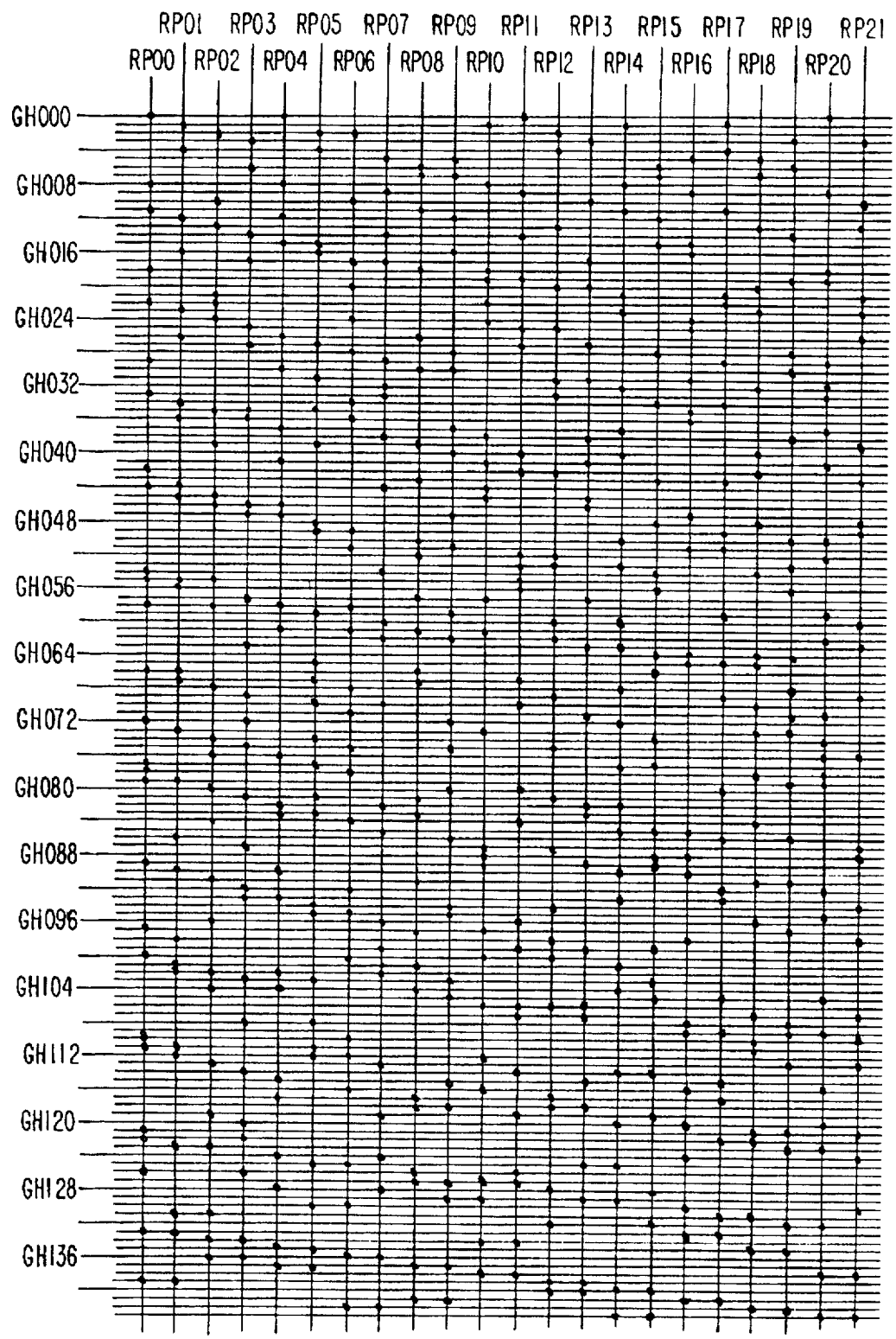
FIG. 16 is a schematic diagram showing yet another representative portion of an illustrative pattern of programmable connections in accordance with the principles of this invention.
Figure 17:
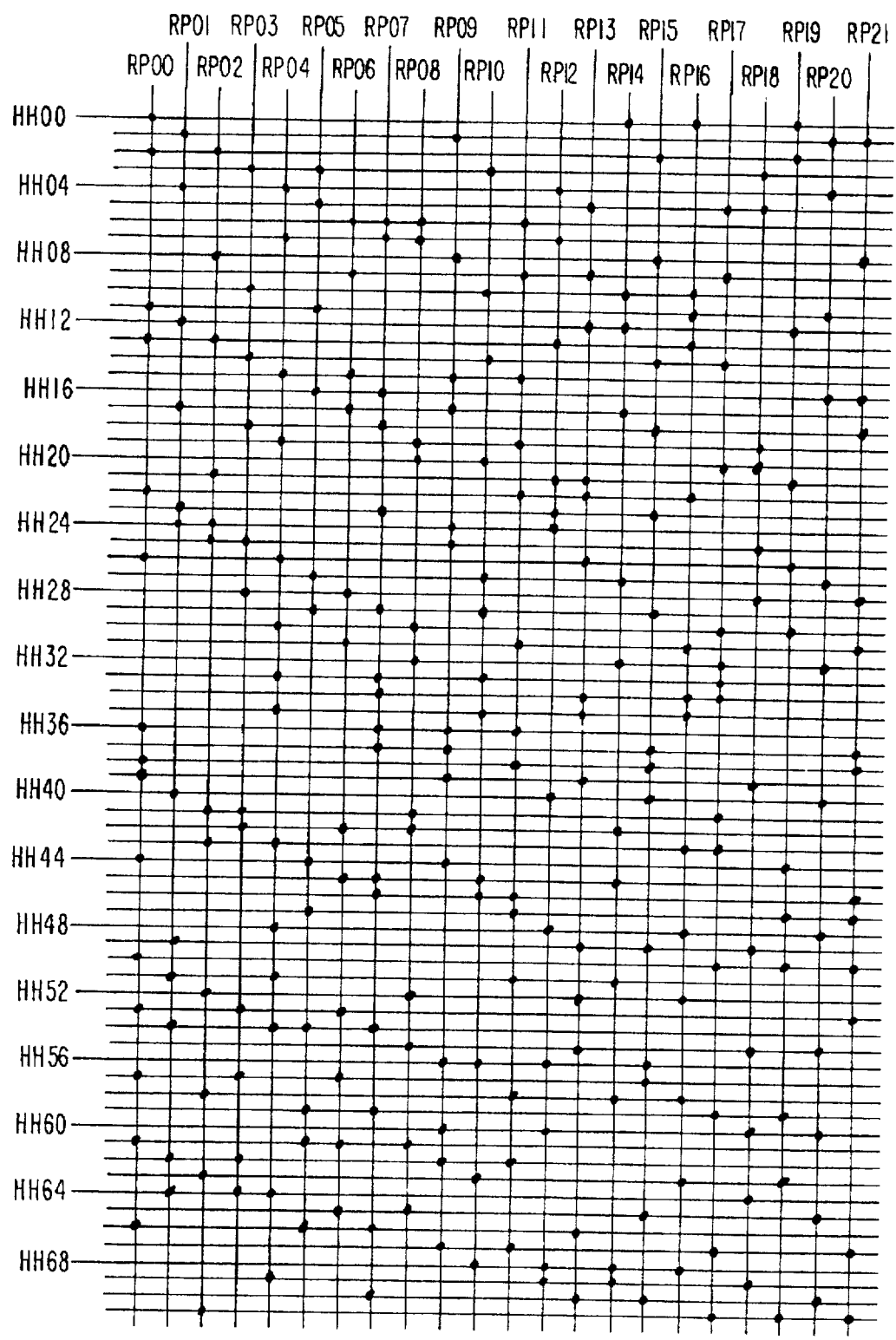
FIG. 17 is a schematic diagram showing still another representative portion of an illustrative pattern of programmable connections in accordance with the principles of this invention.

An example of a pattern of programmable connection which substantially satisfies these constraints or goals is shown in FIGS. 16 and 17. These FIGS. are further explained below.

Once again, not all of these constraints or goals may have to be satisfied for all embodiments. But greater routability results from satisfying more of these items.

FIGS. 8–17 illustrate patterns of programmable connections which can be provided on device 10 to substantially satisfy the various constraints or goals identified above.

Figure 8:
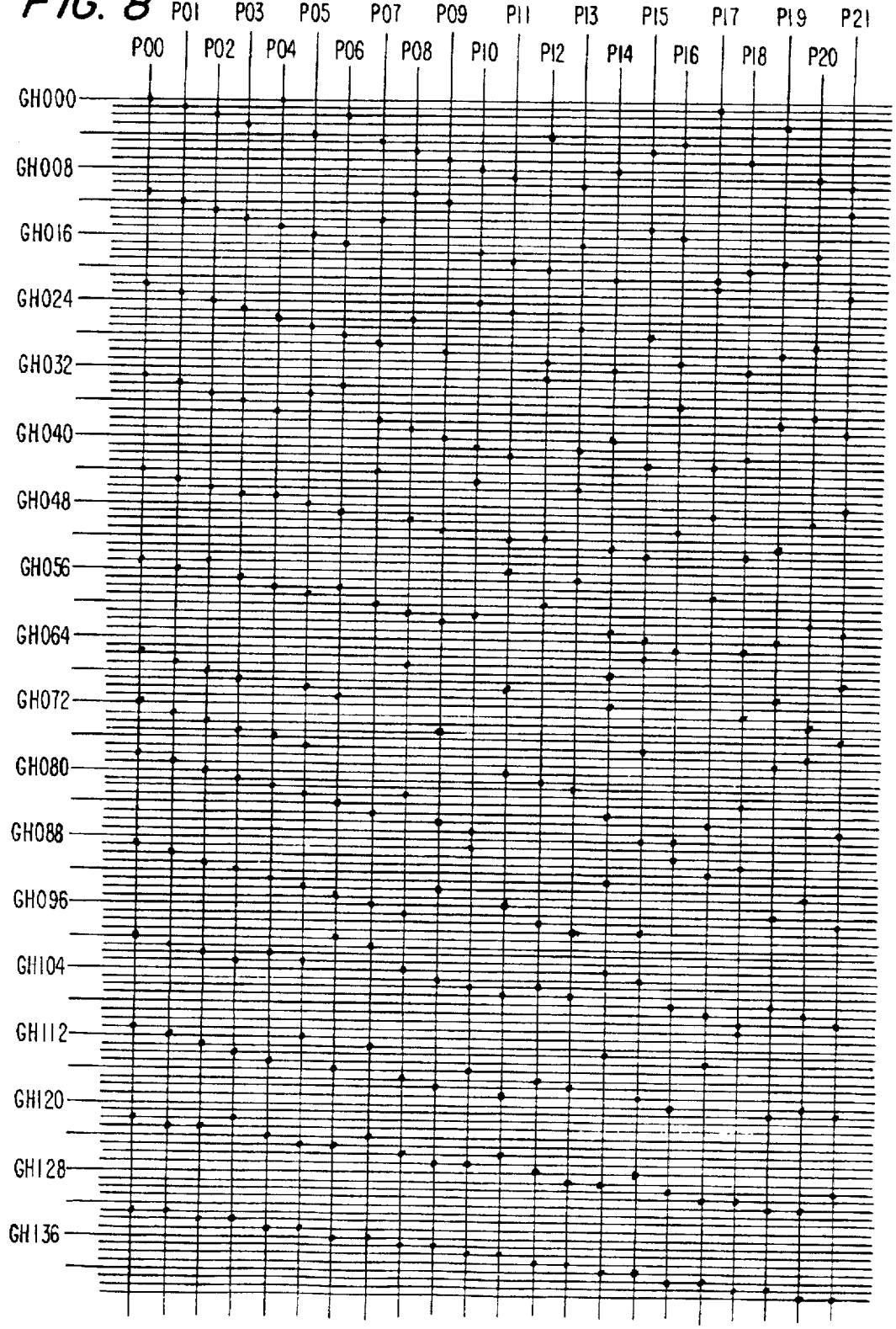
FIG. 8 is a schematic diagram showing a representative portion of an illustrative programmable connection pattern in accordance with the principles of this invention.

FIG. 8 shows a pattern of programmable connections from 144 global horizontal conductors 60 associated with a row to 22 region feeding conductors 90 associated with that row. (These connections are made via elements 64 in FIG. 3.) Conductors 60 are identified as GH000–GH143 in FIG. 8 and several subsequent FIGS. Conductors 90 are identified as P00–P21 in FIG. 8 and subsequent FIGS. Each dot in FIG. 8 (and subsequent FIGS.) indicates the availability of a programmable connection between the conductors intersecting at that dot. Of course, each such connection may be made or not, depending on the programmed state of that connection. The pattern shown in FIG. 8 is used for all rows and all columns of device 10. The FIG. 8 pattern is a basis on which it is said that the patterns shown in (1) FIG. 11, (2) FIGS. 14a–c and 15a–c, and (3) FIGS. 16 and 17 substantially satisfy the sets of constraints or goals that are respectively associated with those groups of FIGS.

FIG. 9 shows a pattern of programmable connections from 72 half-horizontal conductors 70 associated with a row to 22 region feeding conductors 90 associated with that row. (These connections are also made via elements 64 in FIG. 3.) Conductors 70 are identified as HH00–HH71 in FIG. 9 and subsequent FIGS. The pattern shown in FIG. 9 is used for all rows and all columns of device 10. The FIG. 9 pattern is a basis on which it is said that the patterns shown in (1) FIG. 14a–c and 15a–c, and (2) FIGS. 16 and 17 substantially satisfy the sets of constraints or goals that are respectively associated with those groups of FIGS.

FIG. 10 shows a pattern of programmable connections from 24 global vertical conductors 80' associated with the column of RAM regions 40 to 144 global horizontal conductors 60 associated with a row. (These are the connections made via elements 454 and 456 in FIG. 7.) Conductors 80' are identified as RGV00–RGV23 in FIG. 10 and subsequent FIGS. The pattern shown in FIG. 10 is used for all rows of device 10. The pattern shown in FIG. 10 is a basis on which it is said that the patterns shown in FIGS. 12a, 12b, and 13 substantially satisfy the set of constraints or goals that is associated with those FIGS.

As mentioned above, FIG. 11 shows a pattern of programmable connections which substantially satisfies the first set of constraints or goals set forth above. Thus FIG. 11 shows a pattern of programmable connections from 16 horizontal input/output pins 130 associated with a row to 144 global horizontal conductors 70 associated with that row. (These connections are made via elements 132 in FIG. 5.) Input/output pins 130 are identified as HIO00–HIO15 in FIG. 11. The pattern shown in FIG. 11 is used for all rows of device 10.

FIGS. 12a, 12b, and 13 show a pattern of programmable connections which substantially satisfies the second set of constraints or goals set forth above. FIGS. 12a and 12b show a pattern of programmable connections from the RAM output register 450 in each row to the global horizontal conductors 60 associated with that row. (These connections are made via elements 454 and 456 in FIG. 7.) The eight outputs of register 450 in each row are identified as RO0–RO7 in FIGS. 12a and 12b and subsequent FIGS. This pattern differs from row to row, and so the pattern for all ten rows is shown in FIGS. 12a and 12b. FIG. 13 shows a pattern of programmable connections from RAM output register 450 in each row to the 24 global vertical conductors 80' associated with the column of RAM regions 40. (These connections are made via elements 452 in FIG. 7.)

Figure 14A:
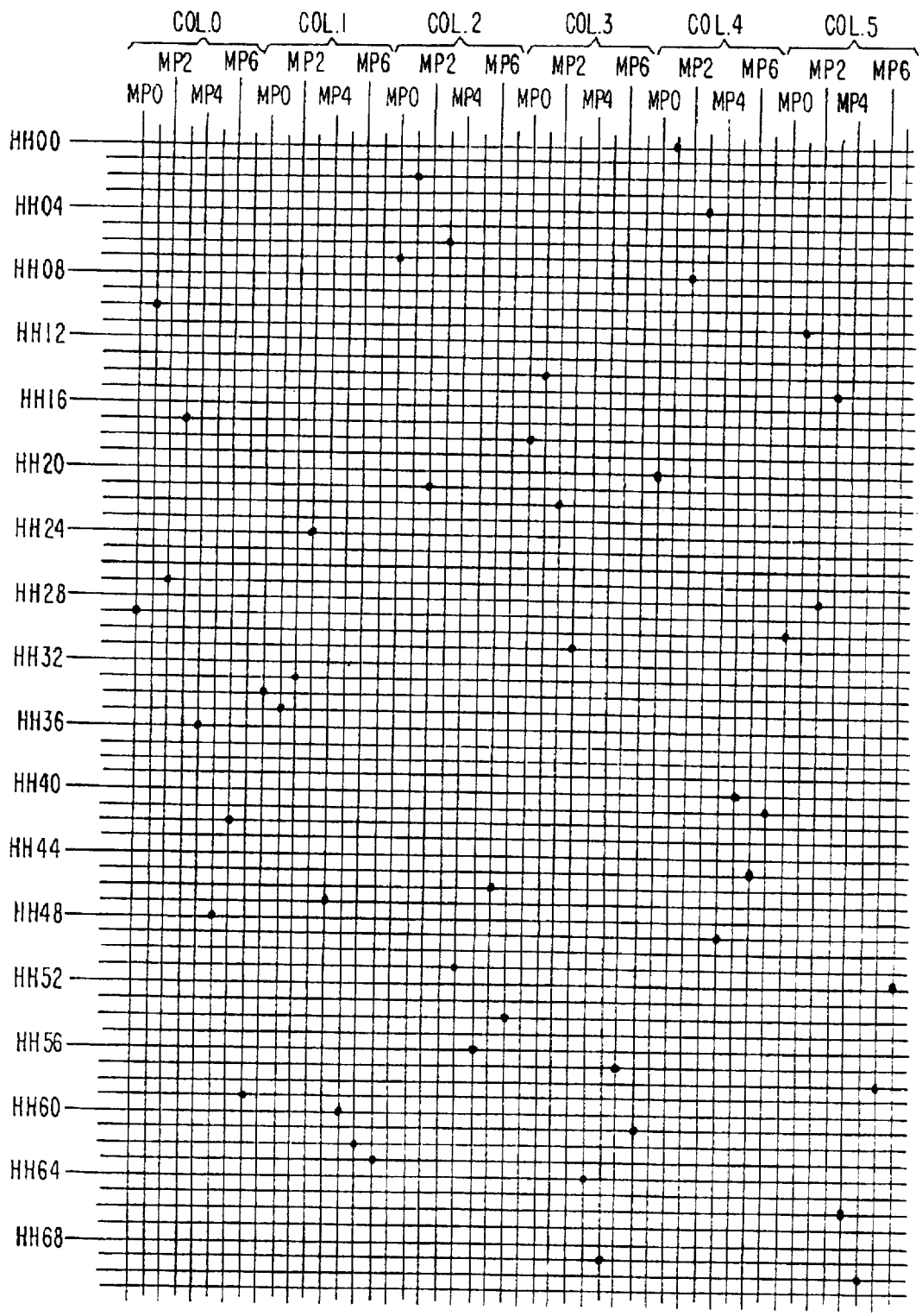
FIGS. 14a–c are collectively a schematic diagram showing yet another representative portion of an illustrative pattern of programmable connections in accordance with the principles of this invention.
Figure 14B:
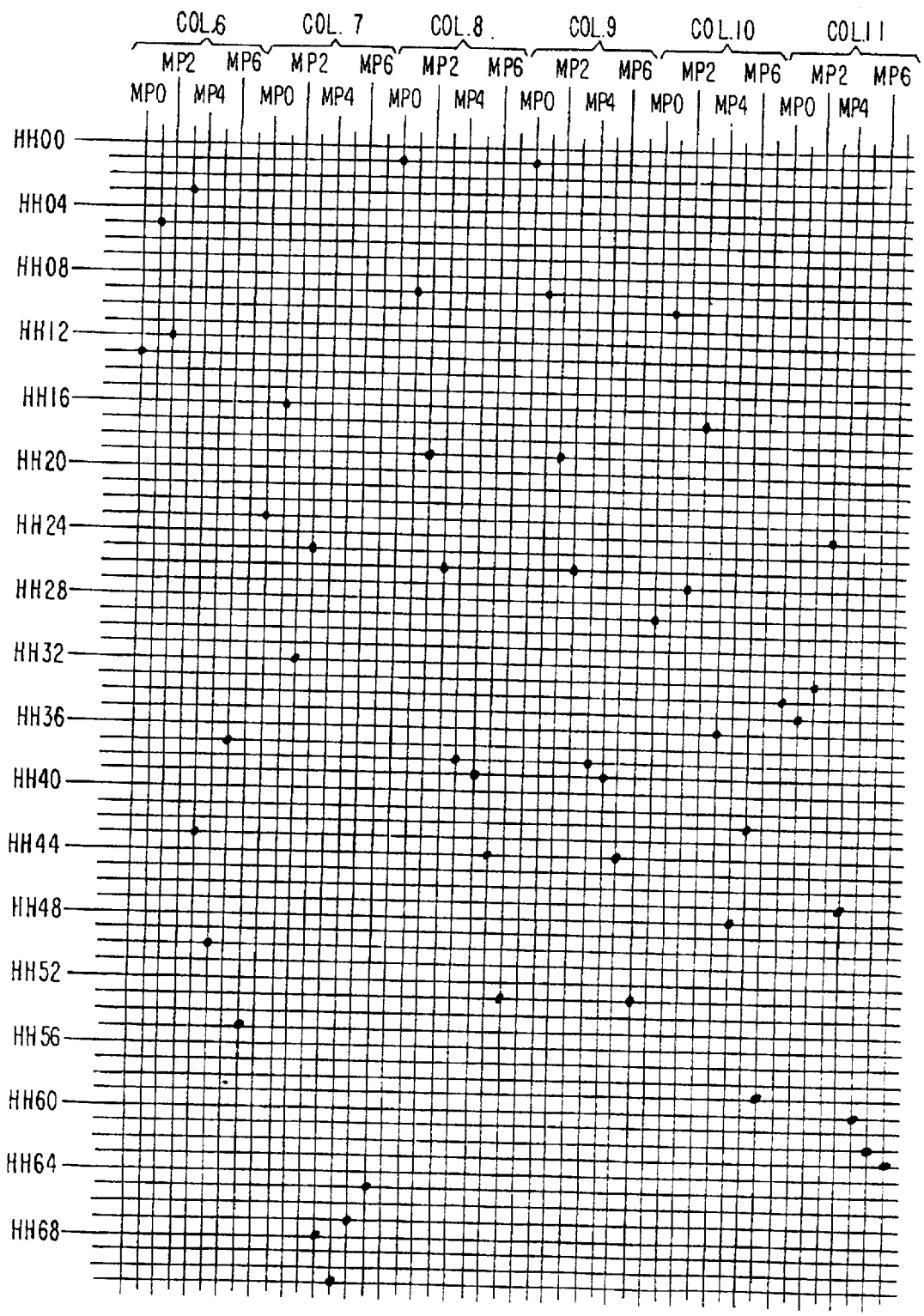
Figure 14C:
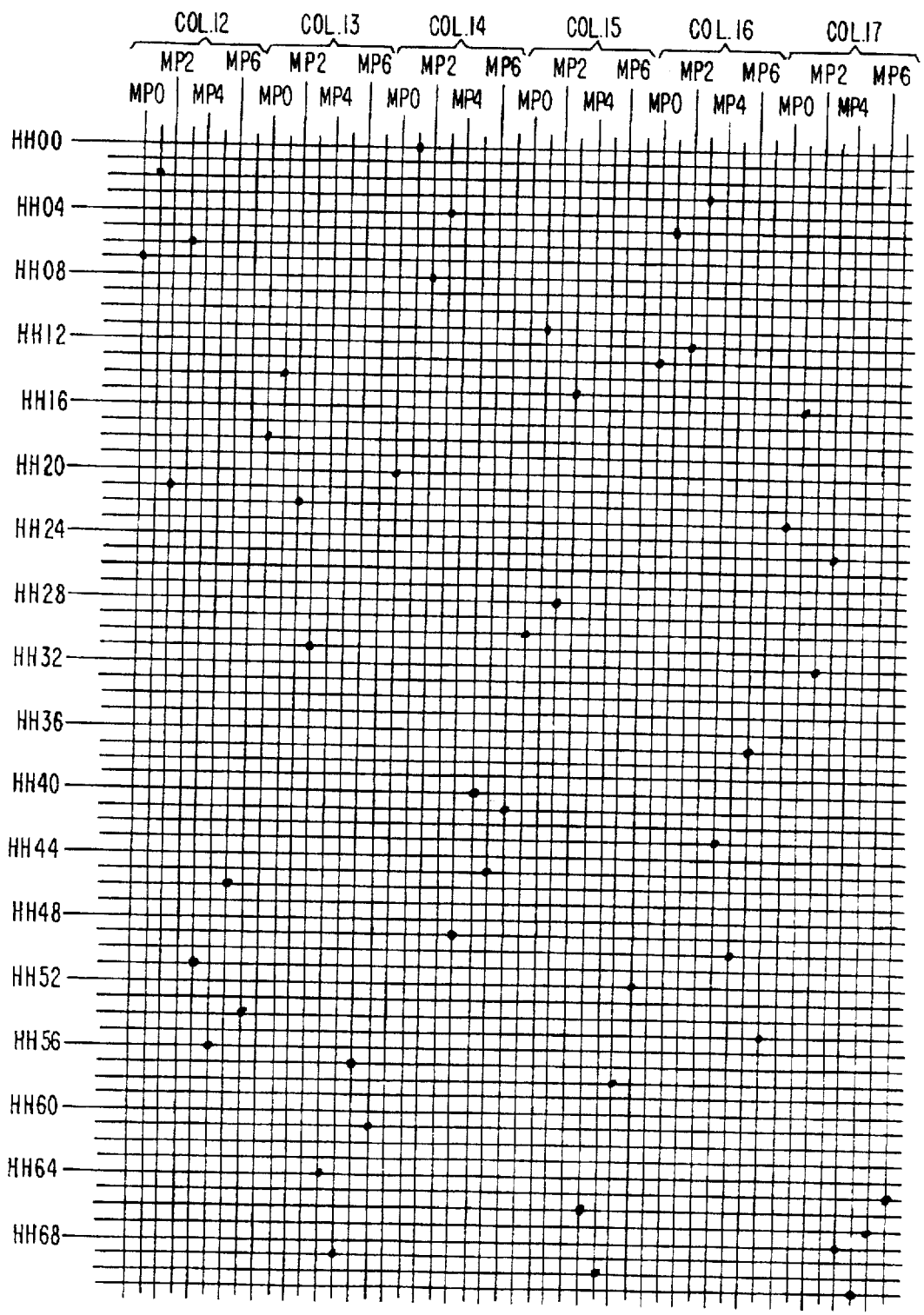
Figure 15A:
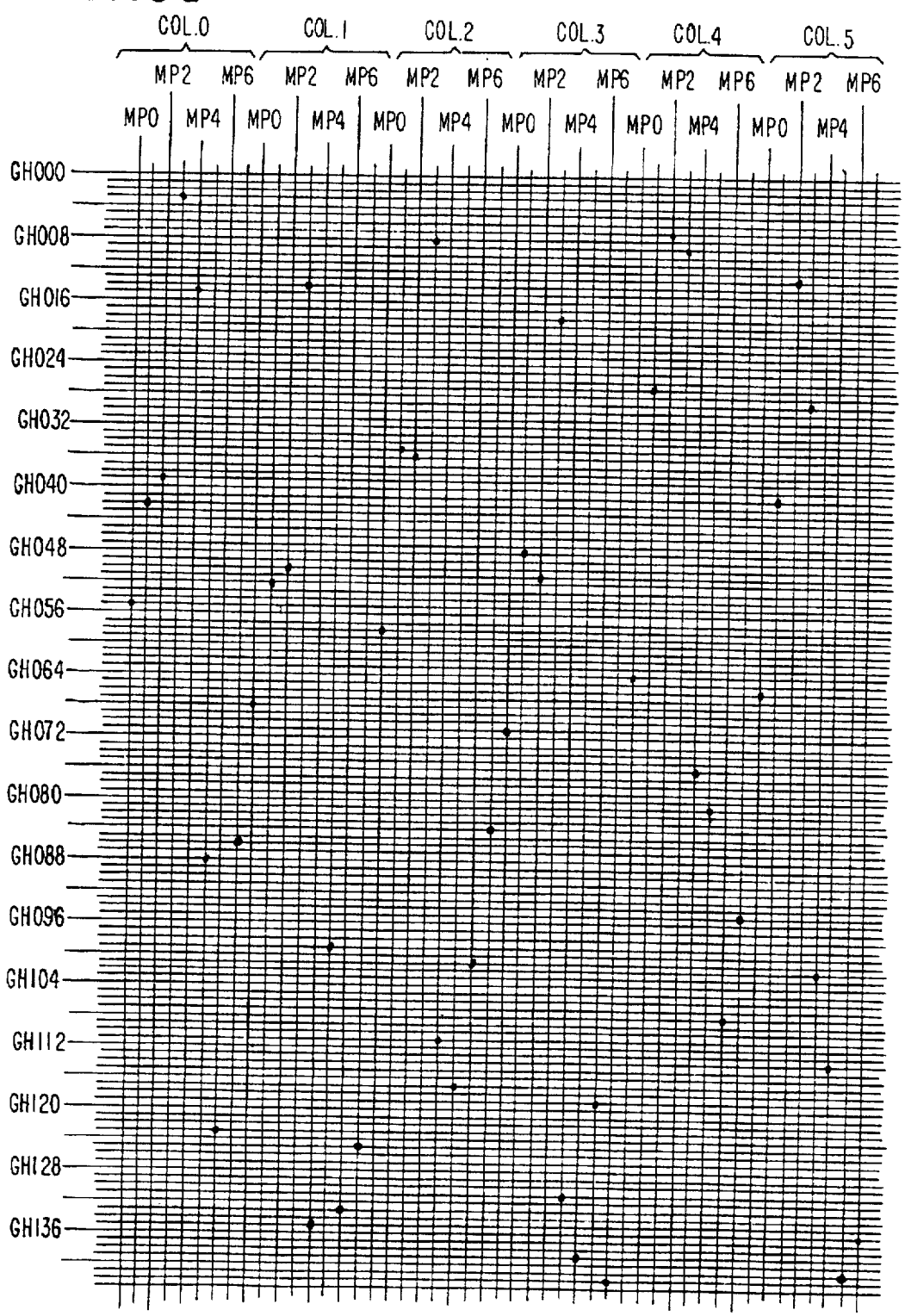
Figure 15B:
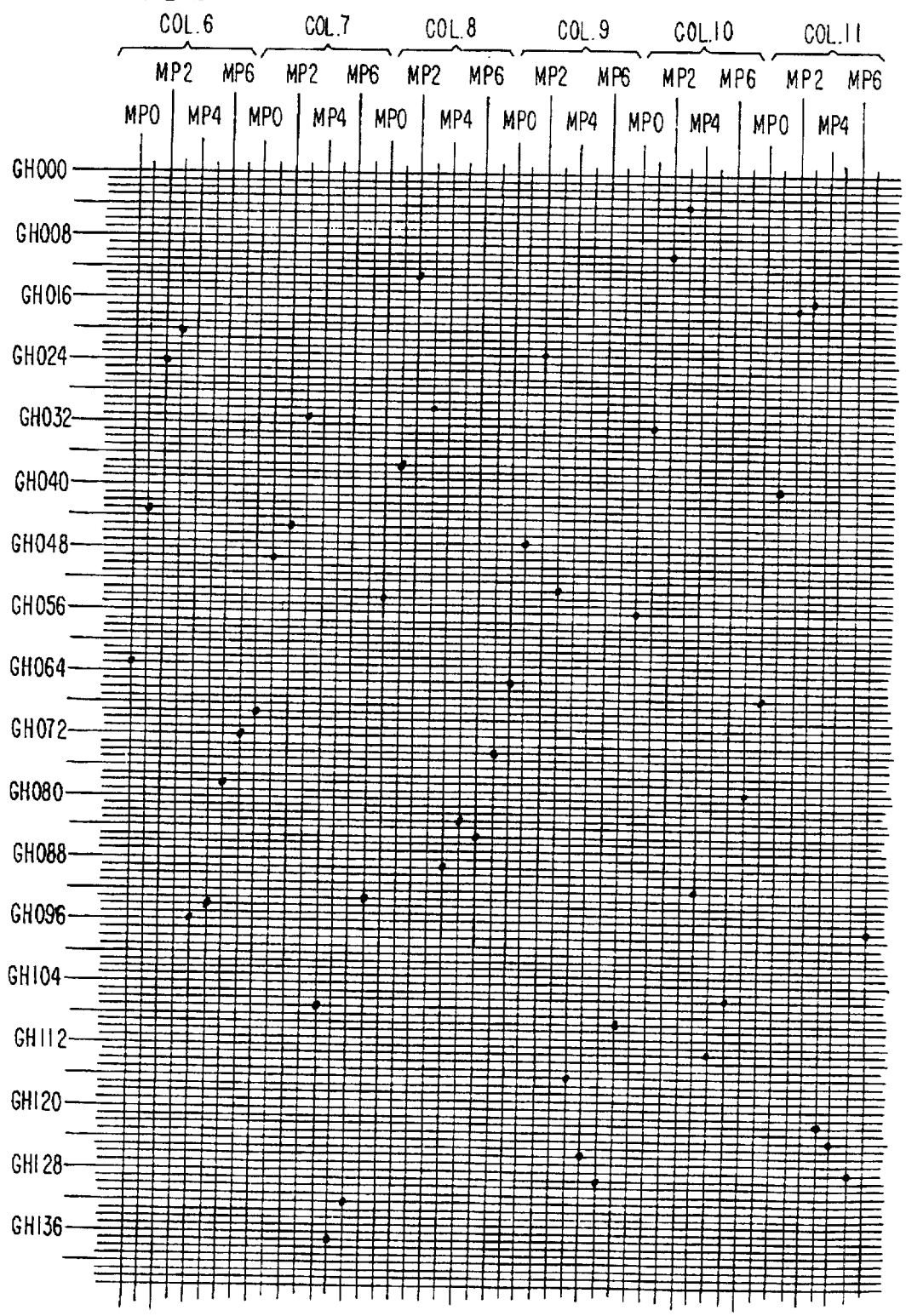
Figure 15C:
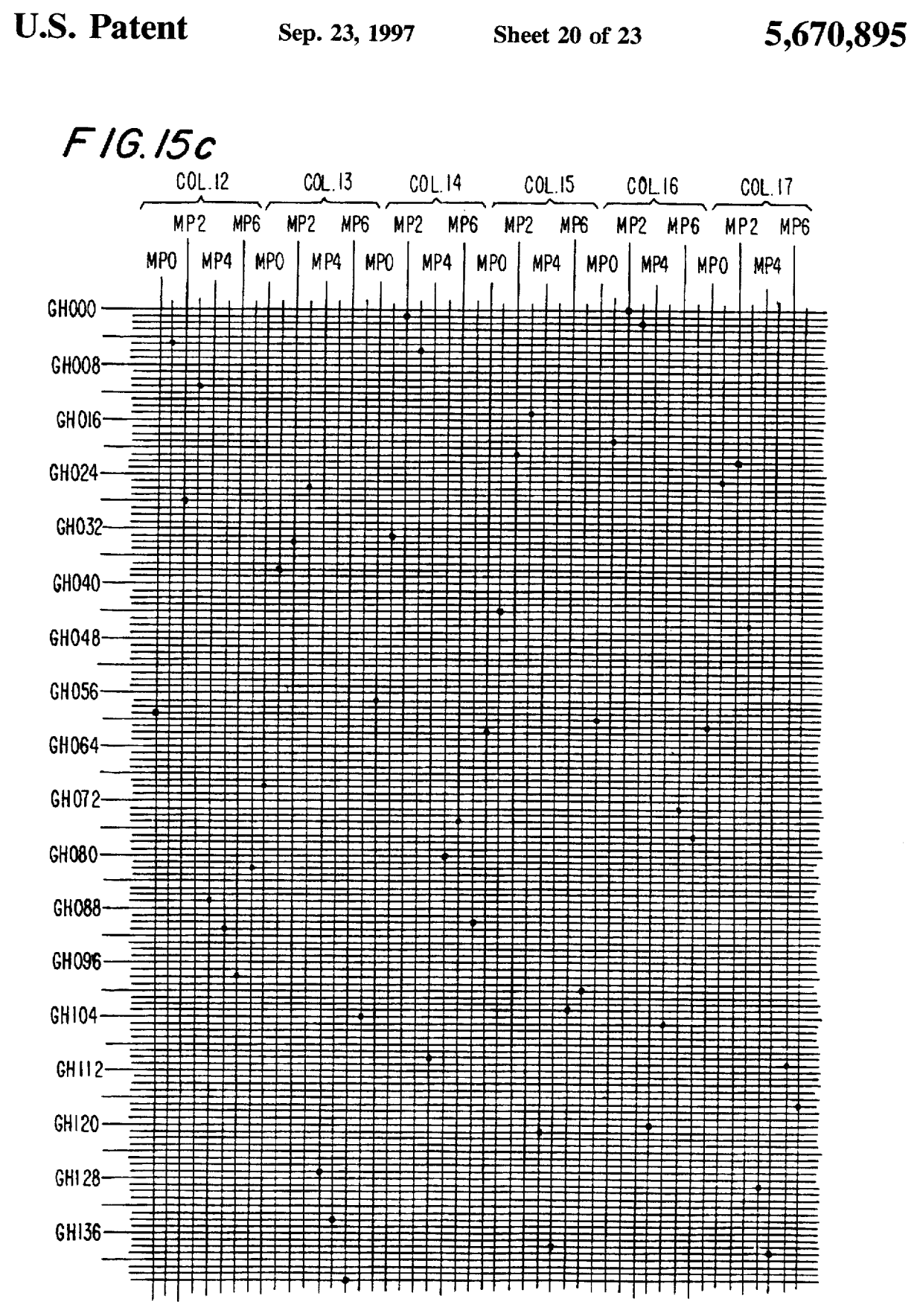

FIGS. 14a–c and 15a–c show a pattern of programmable connections which substantially satisfies the third set of constraints or goals set forth above. FIGS. 14a–c show a pattern of programmable connections from eight swap multiplexers 260 associated with a region 20 in a given row and column to the half-horizontal conductors 70 associated with that row. (These are programmable connections identified in other FIGS. as 84/120.) The eight swap multiplexer outputs in each row and column are identified as MP0–MP7 in FIGS. 14a–c and subsequent FIGS. This pattern is duplicated on the left and right halves of device 10 and is the same for all rows. FIGS. 15a–c show a pattern of programmable connections from the same swap multiplexer outputs shown in FIGS. 14a–c to the global horizontal conductors 60 associated with a row. (These are programmable connections identified in other FIGS. as 82/120.) This pattern is also duplicated on the left and right halves of device 10 and is the same for all rows.

FIGS. 16 and 17 show a pattern of programmable connections which substantially satisfies the fourth set of constraints or goals set forth above. FIG. 16 shows a pattern of programmable connections from 144 global horizontal conductors 60 associated with a row to 22 RAM region feeding conductors 90' feeding the RAM region 40 associated with that row. (These connections are made by elements 64' in FIG. 7.) Conductors 90' are identified as RP00–RP21 in FIG. 16. This pattern in the same for all rows of device 10. FIG. 17 shows a pattern of programmable connections from 72 half-horizontal conductors 70 associated with a row to the same conductors 90' that are shown in FIG. 16. (Again, these connections are made by elements 64' in FIG. 7.) This pattern is the same for both halves (left and right) and all rows of device 10.

It will be understood that the foregoing is only illustrative of the principles of this invention and that various modifications can be made by those skilled in the art without departing from the scope and spirit of the invention. For example, changes can be made in the number of logic modules 30 per logic region 20, in the number of rows and/or columns of logic regions 20, in the number of each type of conductor provided, in the size of the RAM regions, etc.

The invention claimed is:

1. A programmable logic array integrated circuit having a plurality of regions of programmable logic disposed on said circuit in a two-dimensional array of intersecting rows and columns of said regions, each of said rows having an associated plurality of row conductors extending along said row for selectively conveying logic signals to and from the regions in said row, each of said regions having an associated plurality of region feeding conductors, each of which is programmable to selectively feed to the associated region the logic signal on any one of a subset of the row conductors associated with the row that includes said region, each of said regions producing a plurality of intermediate logic signals, each of said regions being paired with another region in the row that includes said region, each of said logic regions including associated programmable region output switches for providing as output logic signals either the intermediate logic signals of said region or the intermediate logic signals of the region that is paired with said region, and each of said regions including associated programmable region output driver circuits for selectively applying each output logic signal of the region output switches associated with said region to a respective one of a subplurality of the row conductors associated with the row that includes said region, each of said rows having an associated plurality of input/output pins, each of said input/output pins having an associated plurality of programmable input drivers for selectively applying a logic signal applied to said input/output pin to a respective one of the row conductors associated with the row that said input/output pin is associated with, and each of said input/output pins also having associated programmable row output switches for selectively applying to said input/output pin the logic signal on any one of a submultiplicity of the row conductors associated with the row that said input/output pin is associated with, said integrated circuit also including a plurality of peripheral conductors, each of which conveys a logic signal adjacent to substantially all rows and all columns of said circuit, each of said rows additionally having associated programmable peripheral conductor switches for selectively applying the logic signal on any one of a further submultiplicity of the row conductors associated with that row to at least one of said peripheral conductors, at least one of said input drivers for each input/output pin selectively applying a logic signal applied to said input/output pin to a respective one of said further submultiplicity of the row conductors associated with the row that said input/output pin is associated with, all of said row conductors to which one of said input drivers is connected also having an approximately similar number of region output driver circuits connected to it, said input drivers associated with each of said input/output pins being connected to row conductors other than the row conductors in said submultiplicity from which the row output switches associated with said input/output pin can apply a logic signal to said input/output pin, the row conductors which can receive the logic signals from the input drivers associated with each row being selected to minimize the number of input/output pins associated with said row that are connectable to each region feeding conductor associated with said row, the row conductors which can receive the logic signal from each input/output pin being further selected so that no region output driver circuits can apply an output logic signal to more than one of the row conductors that can receive a logic signal from an input/output pin, the row conductors to which the region output driver circuits associated with each region selectively apply output logic signals being different from the row conductors to which the region output driver circuits associated with the region paired with said region selectively apply output logic signals, and the row conductors which can receive the logic signal from each input/output pin being still further selected so that each intermediate signal of each pair of regions can be applied to at least one row conductor which is not also capable of receiving a logic signal from an input driver.

2. The apparatus defined in claim 1 wherein all of said rows have a similar number of associated row conductors, a similar number of associated input/output pins, and a similar pattern of input driver connections between said associated row conductors and said associated input/output pins.

3. The apparatus defined in claim 1 wherein each of said input/output pins has two associated input drivers.

4. A programmable logic array integrated circuit having a plurality of regions of programmable logic disposed on said circuit in a two-dimensional array of intersecting rows and columns of said regions, each of said rows including an associated plurality of memory circuits that are capable of storing data and selectively outputting logic signals indicative of the stored data, the memory circuits associated with each of said rows including a plurality of output terminals and a first plurality of programmable switches for selectively applying said logic signals to any one of a plurality of different numbers of said output terminals so that said logic signals applied to said output terminals can represent data bytes having any one of a plurality of different lengths, each of said rows having an associated plurality of row conductors extending along said row for selectively conveying logic signals to and from the regions in said row, a plurality of column conductors extending parallel to said columns for conveying logic signals between said rows, a second plurality of programmable switches associated with each of said output terminals for selectively connecting the output terminal to any one of a subplurality of said column conductors, and a third plurality of programmable switches associated with each of said rows, each of said switches in the third plurality associated with a row selectively connecting a row conductor associated with said row to any one of a submultiplicity of said column conductors, said subpluralities and submultiplicities being predetermined so that the row conductors associated with a row can receive any one of a plurality of different numbers of said bytes to produce, on said row conductors associated with said row, data words including any one of said plurality of different numbers of said bytes, each of said bytes in each data word coming from said output terminals of said memory circuits associated with a respective one of said rows.

5. The apparatus defined in claim 4 wherein at least some of said subpluralities have a column conductor in common with another of said subpluralities.

6. The apparatus defined in claim 5 wherein each of said subpluralities consists of two of said column conductors.

7. The apparatus defined in claim 4 wherein at least some of said submultiplicities have a column conductor in common with another of said submultiplicities.

8. The apparatus defined in claim 7 wherein each of said submultiplicities consists of three of said column conductors.

9. The apparatus defined in claim 4 wherein each of said switches in the third plurality associated with a row can alternatively selectively connect a row conductor associated with said row to one of said output terminals of the memory circuits associated with said row without making use of any of said column conductors.

10. The apparatus defined in claim 9 wherein the third plurality of switches associated with each of said rows includes at least one switch associated with each output terminal of the memory circuits associated with said row for alternatively selectively connecting a row conductor associated with said row to the associated output terminal without making use of any of said column conductors.

11. The apparatus defined in claim 10 wherein the third plurality of switches associated with each of said rows includes two switches associated with each output terminal of the memory circuits associated with said row for alternatively selectively connecting a row conductor associated with said row to the associated output terminal without making use of any of said column conductors, the two switches associated with each of said output terminals being respectively connected to two different row conductors.

12. The apparatus defined in claim 4 wherein the row conductors associated with a row can receive at least a plurality of the following different numbers of bytes having the following lengths: (a) ten bytes of one bit each, (b) eight bytes of two bits each, (c) four bytes of four bits each, and (d) two bytes of eight bits each.

13. The apparatus defined in claim 4 wherein said subpluralities and submultiplicities are additionally predetermined so that the row conductors associated with each of first and second ones of said rows can respectively receive different first and second pluralities of different numbers of said bytes to respectively produce on said row conductors associated with said first and second rows first and second data words respectively including any one of said first and second pluralities of different numbers of said bytes, each of said bytes in each data word coming from said output terminals of said memory circuits associated with a respective one of said rows, and the bytes in said first word being different from the bytes in a concurrent second word.

14. The apparatus defined in claim 13 wherein each of said first and second words can be selected from the following numbers of bytes having the following lengths: (a) five bytes of two bits each, and (b) three bytes of four bits each.

15. The apparatus defined in claim 13 wherein said subpluralities and submultiplicities are additionally predetermined so that the row conductors associated with each of first, second, and third ones of said rows can respectively receive different first, second, and third ones of said bytes.

16. The apparatus defined in claim 15 wherein each of said first, second, and third bytes has eight bits.

17. A programmable logic array integrated circuit having a plurality of regions of programmable logic disposed on said circuit in a two-dimensional array of intersecting rows and columns of said regions, each of said rows having an associated plurality of row conductors extending along said row for selectively conveying logic signals to and from the regions in said row, each of said regions having an associated plurality of region feeding conductors, each of which is programmable to selectively feed to the associated region the logic signal on any one of a subset of the row conductors associated with the row that includes said region, each of said regions producing a plurality of intermediate logic signals, each of said regions being paired with another region in the row that includes said region, each of said logic regions including associated programmable region output switches for providing as output logic signals either the intermediate logic signals of said region or the intermediate logic signals of the region that is paired with said region, and each of said regions including associated programmable region output driver circuits for selectively applying each output logic signal of the region output switches associated with said region to a respective one of a subplurality of the row conductors associated with the row that includes said region, said subsets and subpluralities being predetermined so that a majority of said output logic signals of the region output switches associated with each region in each row are precluded from being applied via a row conductor associated with said row to any region feeding conductor associated with a region in said row that can also receive via a row conductor associated with said row an output logic signal from another of the region output switches associated with said region.

18. The apparatus defined in claim 17 wherein said subsets and subpluralities are additionally predetermined so that each of said output logic signals of the region output switches associated with each region in each row and not included in said majority of said output logic signals of said region output switches can be applied via row conductors associated with said row to region feeding conductors associated with regions in said row that also receive via row conductors associated with said row an output logic signal from at most two other region output switches associated with said region.

19. The apparatus defined in claim 17 wherein approximately half of the row conductors associated with each row pass along one side of said row and all remaining row conductors associated with said row pass along a side of said row opposite said one side, and wherein approximately half of said region output switches associated with each region in each row can apply their output logic signals via the output driver circuits associated with said region only to those of the row conductors that pass along said one side of said row and all remaining region output switches associated with said region can apply their output logic signals via the output driver circuits associated with said region only to those of the row conductors that pass along said side opposite said one side.

20. The apparatus defined in claim 19 wherein each region in each row comprises a plurality of programmable logic modules, each of which produces a respective one of the intermediate logic signals of the region of which said logic module is a part.

21. The apparatus defined in claim 20 wherein approximately half of said logic modules in each region are closer than all remaining logic modules in said region to said one side of the row that includes said region, and wherein the output logic signals applied to the row conductors passing along said one side of each row come exclusively from intermediate logic signals produced by the logic modules in the regions of said row that are closer to said one side of said row.

22. The apparatus defined in claim 21 wherein the output logic signals applied to the row conductors passing along said side of each row opposite said one side of said row come exclusively from intermediate logic signals produced by said remaining logic modules in regions of said row.

23. The apparatus defined in claim 17 further comprising:

a plurality of fractional row conductors associated with each of said rows and extending along a fraction of the regions in the associated row for selectively conveying logic signals to and from the regions in the fraction of the associated row, each of said region feeding conductors associated with a region in a fraction of a row being alternatively programmable to selectively feed to the associated region the logic signal on any one of a further subset of the fractional row conductors associated with the row that includes said region, each of said regions in a fraction of a row including associated second programmable region output driver circuits for selectively applying each output logic signal of the region output switches associated with said region to a respective one of a further subplurality of the fractional row conductors associated with the row that includes said region, said further subsets and further subpluralities being predetermined so that a majority of said output logic signals of the region output switches associated with each region in a fraction of a row are precluded from being applied via a fractional row conductor associated with said row to any region feeding conductor associated with a region in said row that can also receive via a fractional row conductor associated with said row an output logic signal from another of the region output switches associated with said region.

24. The apparatus defined in claim 23 wherein said further subsets and further subpluralities are additionally predetermined so that each of said output logic signals of the region output switches associated with each region in each fraction of a row not included in said majority of said output logic signals of said region output switches can be applied via fractional row conductors associated with said row to region feeding conductors associated with regions in said row that also receive via fractional row conductors associated with said row an output logic signal from at most two other region output switches associated with said region.

25. The apparatus defined in claim 23 wherein approximately half of the fractional row conductors associated with each row pass along one side of said row and all remaining fractional row conductors associated with said row pass along a side of said row opposite said one side, and wherein approximately half of said region output switches associated with each region in each row can apply their output logic signals via the output driver circuits associated with said region only to those of the fractional row conductors that pass along said one side of said row and all remaining region output switches associated with said region can apply their output logic signals via the output driver circuits associated with said region only to those of the fractional row conductors that pass along said side opposite said one side.

26. The apparatus defined in claim 25 wherein each region in each row comprises a plurality of programmable logic modules, each of which produces a respective one of the intermediate logic signals of the region of which said logic module is a part, wherein approximately half of said logic modules in each region are closer than all remaining logic modules in said region to said one side of the row that includes said region, and wherein the output logic signals applied to the fractional row conductors passing along said one side of each row come exclusively from intermediate logic signals produced by the logic modules in the regions of said row that are closer to said one side of said row.

27. The apparatus defined in claim 26 wherein the output logic signals applied to the fractional row conductors passing along said side of each row opposite said one side of said row come exclusively from intermediate logic signals produced by said remaining logic modules in regions of said row.

28. A programmable logic array integrated circuit having a plurality of regions of programmable logic disposed on said circuit in a two-dimensional array of intersecting rows and columns of said regions, each of said rows having an associated plurality of row conductors extending along said rows for selectively conveying logic signals to and from the regions in said row, each of said regions having an associated plurality of programmable region feeding conductors, each of which selectively feeds to the associated region the logic signal on any one of a subplurality of the row conductors associated with the row that includes said region, each of said rows having an associated plurality of memory circuits and an associated plurality of memory feeding conductors, each of which selectively feeds to the memory circuits associated with the row with which said memory feeding conductor is associated the logic signal on any one of a submultiplicity of the row conductors associated with said row, said submultiplicities being predetermined so that each row conductor associated with each row can feed the logic signal on that row conductor to a predetermined plural number of said memory feeding conductors, said plural number being less than all of said memory feeding conductors and approximately the same for all of said row conductors, said submultiplicities being further predetermined so that each row conductor associated with a row can feed a group of said memory feeding conductors associated with said row that is at least 50% different than the group of said memory feeding conductors that any other row conductor associated with said row can feed, and said subpluralities and submultiplicities being still further predetermined so that the pattern in which said row conductors associated with each row can feed the region feeding conductors associated with each region in said row is substantially the same as a subset of the pattern in which said row conductors can feed the memory feeding conductors associated with said row.

29. The apparatus defined in claim 28 wherein the pattern in which the row conductors associated with each row can feed the memory feeding conductors associated with said row is substantially the same for all of said rows.

30. The apparatus defined in claim 28 wherein said row conductors associated with each row are separated into a plurality of subgroups, and wherein said submultiplicities are still further predetermined so that no more than a predetermined number of said row conductors in each subgroup can feed any one of said memory feeding conductors.

31. The apparatus defined in claim 28 wherein each row conductor associated with each row can feed any of four memory feeding conductors associated with said row.

32. The apparatus defined in claim 31 wherein said submultiplicities are further predetermined so that no two row conductors associated with each row can feed more than two of the same memory feeding conductors associated with said row.

33. A programmable logic array integrated circuit having a plurality of logic modules, each of which receives an associated plurality of input signals and each of which is programmable to produce an associated output signal which is a programmable logic function of the associated input signals, said circuit further including a network of conductors for selectively conveying the output signal of each logic module to others of said logic modules in order to make said output signal available for use as one said input signals to said others of said logic modules, said network having an input lead respectively associated with each of said logic modules through which said network normally receives the output signal of the associated logic module, said circuit comprising:

a first programmable switch for applying either the output signal of a first of said logic modules or the output signal of a second of said logic modules to said input lead that is associated with said first logic module; and a second programmable switch for applying either the output signal of said second logic module or the output signal of a third of said logic modules to said input lead that is associated with said second logic module.

34. The apparatus defined in claim 33 wherein said logic modules are grouped in mutually exclusive subpluralities of said logic modules, wherein said first and third logic modules are in a first of said subpluralities, and wherein said second logic module is in a second of said subpluralities.

35. The apparatus defined in claim 34 wherein said network comprises a plurality of conductors which are programmably selectively interconnectable in a predetermined pattern, and wherein said input lead associated with said first logic module is connected to a subset of said conductors which is at least partly different from the subset of said conductors to which said input lead associated with said second logic module is connected.

* * * * *